United States Patent
Kim et al.

(10) Patent No.: US 9,589,625 B2
(45) Date of Patent: Mar. 7, 2017

(54) METHOD OF OPERATING MEMORY DEVICE AND REFRESH METHOD OF THE SAME

(71) Applicant: Samsung Electronics Co., Ltd., Suwon-si (KR)

(72) Inventors: Hyun-Ki Kim, Yongin-si (KR); Hyung-Sik You, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/742,821

(22) Filed: Jun. 18, 2015

(65) Prior Publication Data

US 2016/0027495 A1  Jan. 28, 2016

(30) Foreign Application Priority Data

Jul. 24, 2014 (KR) ........................ 10-2014-0093736

(51) Int. Cl.

| | |
|---|---|
| *G11C 11/24* | (2006.01) |
| *G11C 7/00* | (2006.01) |
| *G11C 11/4074* | (2006.01) |
| *G11C 11/406* | (2006.01) |
| *G11C 11/4091* | (2006.01) |
| *G11C 7/06* | (2006.01) |
| *G11C 7/08* | (2006.01) |
| *G11C 11/4094* | (2006.01) |

(52) U.S. Cl.
CPC .......... *G11C 11/4074* (2013.01); *G11C 7/065* (2013.01); *G11C 7/08* (2013.01); *G11C 11/406* (2013.01); *G11C 11/4091* (2013.01); *G11C 11/40611* (2013.01); *G11C 11/4094* (2013.01); *G11C 2211/4065* (2013.01); *G11C 2211/4068* (2013.01)

(58) Field of Classification Search
USPC ........................................................ 365/149
See application file for complete search history.

(56) References Cited

U.S. PATENT DOCUMENTS

| | | | |
|---|---|---|---|
| 6,879,197 B2 | 4/2005 | Kang et al. | |
| 7,639,540 B2 | 12/2009 | Kim et al. | |
| 8,842,483 B2 | 9/2014 | Pyo et al. | |
| 2005/0013160 A1 | 1/2005 | Higeta et al. | |
| 2005/0286301 A1 | 12/2005 | Mochizuki | |
| 2006/0092735 A1 | 5/2006 | Do et al. | |

(Continued)

FOREIGN PATENT DOCUMENTS

| | | |
|---|---|---|
| KR | 10-2004-0108018 A | 12/2004 |
| KR | 10-2008-0079496 A | 9/2008 |
| KR | 10-2009-0130093 A | 12/2009 |

*Primary Examiner* — Anthan Tran
(74) *Attorney, Agent, or Firm* — Muir Patent Law, PLLC

(57) ABSTRACT

A method of operating a memory device may include: providing a first power supply voltage to a sense amplifier during a first time interval, the first time interval being between a first time at which a voltage is provided to a first bit line, and a second time at which a pre-charge command is received; and providing a second power supply voltage to the sense amplifier during a second time interval, during which the word line is enabled after the pre-charge command is received. The second power supply voltage may be greater than the first power supply voltage.

9 Claims, 24 Drawing Sheets

(56) References Cited

U.S. PATENT DOCUMENTS

| | | |
|---|---|---|
| 2008/0205134 A1 | 8/2008 | Kato |
| 2010/0165764 A1* | 7/2010 | Petralia .................. G11C 5/145 |
| | | 365/200 |
| 2010/0214837 A1* | 8/2010 | Sako ....................... G11C 5/147 |
| | | 365/185.03 |
| 2013/0176803 A1* | 7/2013 | Lee .......................... G11C 7/08 |
| | | 365/203 |
| 2013/0229868 A1* | 9/2013 | Koh .................... G11C 11/5628 |
| | | 365/185.03 |

* cited by examiner

METHOD OF OPERATING MEMORY DEVICE AND REFRESH METHOD OF THE SAME

CROSS-REFERENCE TO RELATED APPLICATION

This application claims priority under 35 USC §119 to Korean Patent Applications No. 10-2014-0093736, filed on Jul. 24, 2014 in the Korean Intellectual Property Office (KIPO), the contents of which are herein incorporated by reference in their entirety.

BACKGROUND

1. Technical Field

The present disclosure relates generally to a memory device and more particularly to a method of operating the memory device and a refresh method of the memory device.

2. Description of the Related Art

A volatile memory may lose its stored data when power supply is cut off. Examples of volatile memory include DRAM, SRAM, and so forth.

Various research to decrease a power supply voltage used in the DRAM is in progress so that the power consumption in the DRAM may be decreased.

SUMMARY

Some example embodiments provide a method of operating a memory device capable of increasing a performance by restoring a memory cell based on a second power supply voltage that is greater than a first power supply voltage during a second time interval, during which the word line is enabled after the pre-charge command is received.

Some example embodiments provide a refresh method of the memory device capable of increasing the performance by refreshing the memory cell based on a second power supply voltage that is greater than a first power supply voltage during a second time interval, during which the word line is enabled after the row enable signal is disabled.

In some example embodiments, a method of operating a memory device including word lines and bit lines connected to a plurality of memory cells includes: enabling a first word line of the word lines, the first word line corresponding to a first address corresponding to a selected memory cell of the plurality of memory cells, after receiving an active command; providing a first power supply voltage to a sense amplifier connected to a first bit line of the bit lines, the first bit line corresponding to the selected memory cell based on a first control signal during a first time interval, the first time interval being between a first time at which a voltage is provided to the first bit line based on the first power supply voltage, and a second time at which a pre-charge command is received; providing a second power supply voltage to the sense amplifier based on a second control signal during a second time interval, during which the word line is enabled after the pre-charge command is received, the second power supply voltage being irrespective of and greater than the first power supply voltage; and restoring the selected memory cell corresponding to the first address is restored based on the first power supply voltage and the second power supply voltage.

In some example embodiments, during the first time interval, the first control signal may be a first logic level and the second control signal is a second logic level opposite to the first logic level. During the second time interval, the first control signal may be the second logic level and the second control signal is the first logic level.

In some example embodiments, a ground voltage is provided to the sense amplifier based on a third control signal. During the first time interval and the second time interval, the third control signal may be the first logic level.

In some example embodiments, during the first time interval, the sense amplifier may pre-charge the first bit line and a complementary first bit line based on the first power supply voltage. During the second time interval, the sense amplifier may pre-charge the first bit line and the complementary first bit line based on the second power supply voltage.

In some example embodiments, a voltage of a capacitor of the selected memory cell corresponding to the first address may be determined based on the second time interval. The voltage of the capacitor may be increased as the second time interval is increased.

In some example embodiments, a voltage of the capacitor of the selected memory cell corresponding to the first address may be determined based on the second power supply voltage. The voltage of the capacitor may be increased as the second power supply voltage is increased.

In some example embodiments, the first power supply voltage may be provided by regulating a first external voltage using a first regulator. The second power supply voltage may be provided by regulating a second external voltage using a second regulator.

In some example embodiments, the first power supply voltage may be provided by regulating a first external voltage using a first regulator. The second power supply voltage may be provided by regulating the first external voltage using a second regulator.

In some example embodiments, the first power supply voltage may be provided by regulating a first external voltage using a first regulator. The second power supply voltage may be provided by boosting the first external voltage using a charge pump.

In some example embodiments, each of the first power supply voltage and the second power supply voltage is provided by controlling a resistance value of an internal resistor. During the first time interval, the resistance value may be a first resistance value. During the second time interval, the resistance value may be a second resistance value.

In some example embodiments, a refresh method of a memory device including word lines and bit lines connected to a plurality of memory cells includes: enabling a first word line of the word lines, the first word line corresponding to a first address corresponding to a selected memory cell of the plurality of memory cells, after receiving a refresh command; providing a first power supply voltage to a sense amplifier connected to a first bit line of the bit lines, the first bit line corresponding to the selected memory cell, based on a first control signal during a first time interval, the first time interval being between a first time at which a voltage is provided to the first bit line based on the first power supply voltage, and a second time at which a row enable signal that is enabled based on the refresh command is disabled; providing a second power supply voltage to the sense amplifier based on a second control signal during a second time interval, during which the word line is enabled after the row enable signal is disabled, the second power supply voltage being greater than the first power supply voltage; and refreshing the selected memory cell corresponding to the first address based on the first power supply voltage and the second power supply voltage.

In some example embodiments, the second time interval may be increased if the first time interval is decreased.

In some example embodiments, a voltage of a capacitor of the memory cell corresponding to the access address may be increased if the second time interval is increased.

In some example embodiments, a voltage of the capacitor of the memory cell corresponding to the access address may be increased if the second power supply voltage is increased.

In some example embodiments, the first power supply voltage may be provided by regulating a first external voltage using a first regulator. The second power supply voltage may be provided by regulating the first external voltage using a second regulator. A memory cell array included in the memory device may be a three-dimensional memory array.

In some example embodiments, a method of operating a memory device may be capable of increasing a performance by restoring a memory cell based on a second power supply voltage that is greater than a first power supply voltage during a second time interval, during which the word line is enabled after the pre-charge command is activated.

In some example embodiments, a method of operating a memory device including word lines and bit lines connected to a plurality of memory cells includes: generating a first power supply voltage having a first voltage level greater than a ground voltage level, and a second power supply voltage having a second voltage level greater than the first voltage level, based on an external power supply voltage received from outside the memory device; enabling a first word line of the word lines connected to a selected memory cell of the memory cells; providing the first power supply voltage to a sense amplifier connected to a first bit line of the bit lines, the first bit line corresponding to the selected memory cell, after enabling the first word line, such that a first voltage is provided to the first bit line based on the first power supply voltage; and providing the second power supply voltage to the sense amplifier during enabling the first word line, such that a second voltage is provided to the first bit line based on the second power supply voltage. A voltage level of the second voltage is greater than a voltage level of the first voltage.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
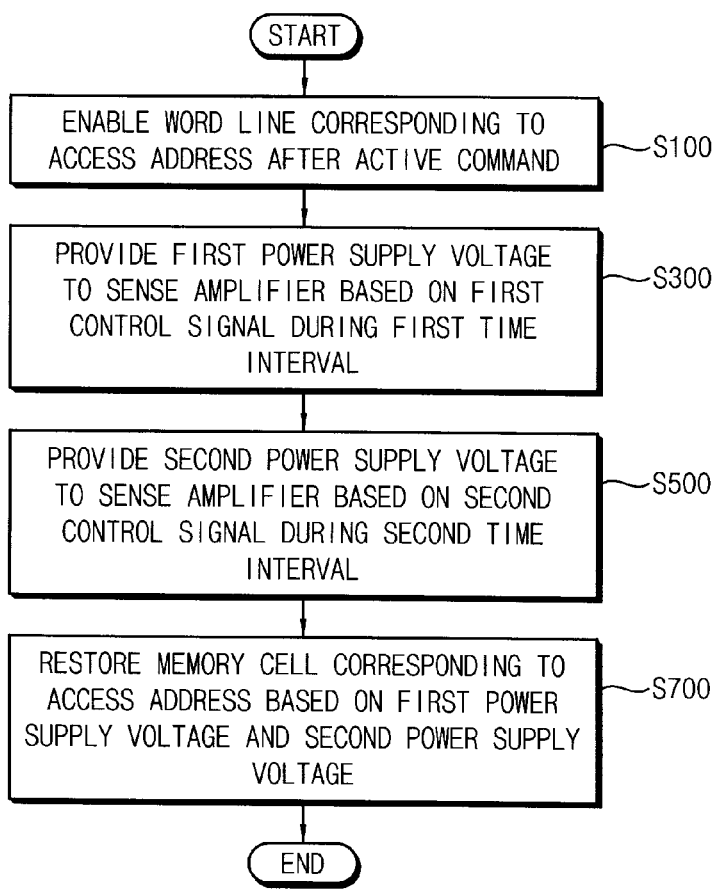
FIG. 1 is a flow chart illustrating a method of operating a memory device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are used to distinguish one element from another. Thus, a first element discussed below could be termed a second element without departing from the teachings of the present inventive concept. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
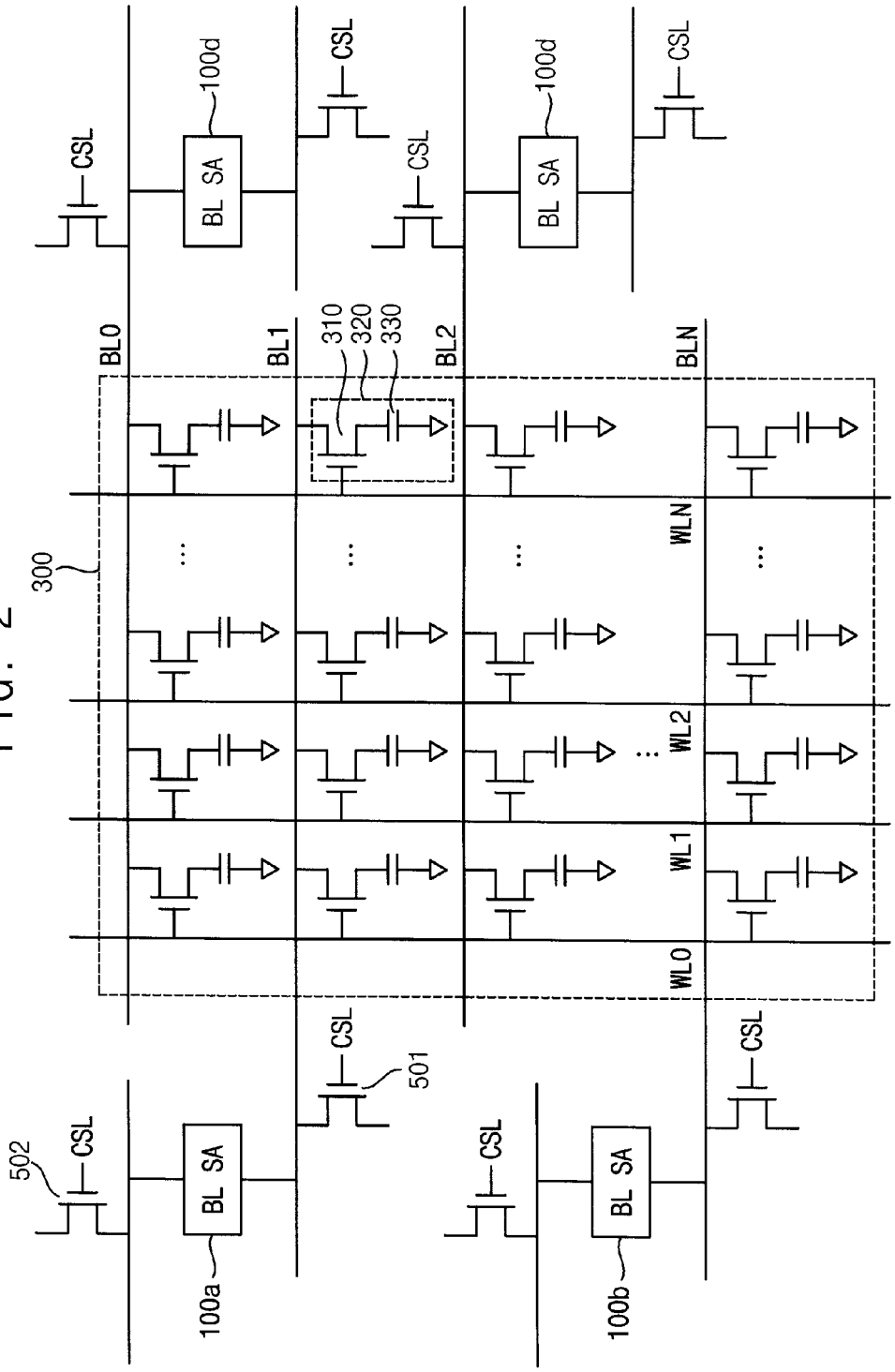
FIG. 2 is a circuit diagram illustrating a memory cell array and a sense amplifier included in the memory device according to example embodiments.
Figure 3:
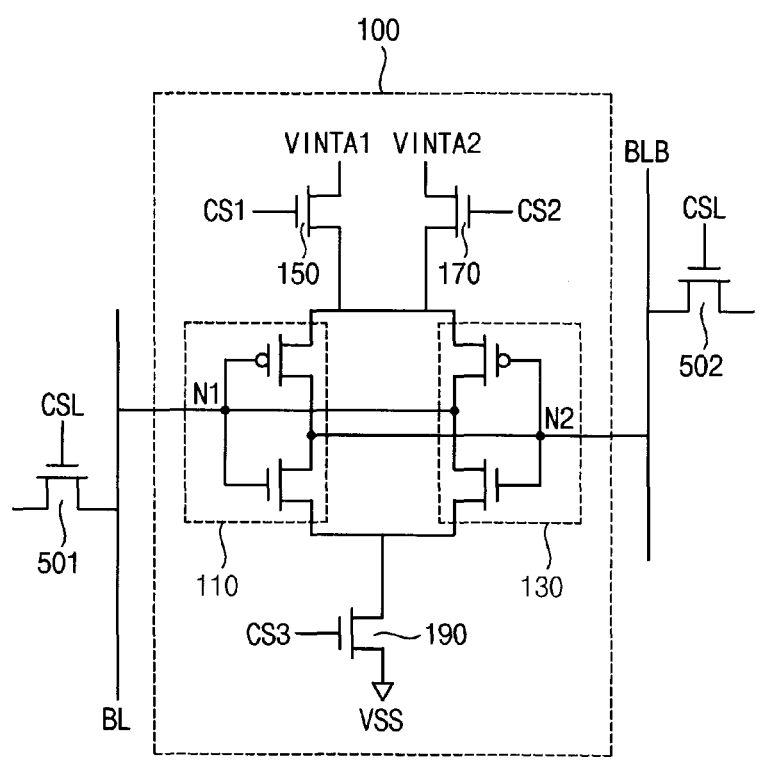
FIG. 3 is a circuit diagram illustrating an example of the sense amplifier of FIG. 2 according to example embodiments.

FIG. 1 is a flow chart illustrating a method of operating a memory device according to example embodiments. FIG. 2 is a circuit diagram illustrating a memory cell array and a sense amplifier included in the memory device according to example embodiments. FIG. 3 is a circuit diagram illustrating an example of the sense amplifier of FIG. 2 according to example embodiments.

Referring to FIGS. 1 to 3, in a method of operating a memory device, a word line WL corresponding to an access address (e.g., a received address for accessing one or more memory cells) is enabled after receiving an active command ACT (S100). The access address may be input from outside the memory device. As will be described referring to FIG. 8, when the active command ACT is received, a row enable signal PRD may be enabled. If the row enable signal PRD is enabled, the word line WL corresponding to the access address may be enabled. Also, when the active command ACT is received, the row enable signal PRD and the word line WL corresponding to the access address may be simultaneously enabled.

A first power supply voltage VINTA1 is provided to a sense amplifier 100 based on a first control signal CS1 during a first time interval T1 (S300). The first control signal CS1 may be generated by a control circuit (not shown) to which an external power supply voltage is provided. Thus, a logic high level of the first control signal CS1 may have a voltage level of the external power supply voltage. The first time interval T1 is between a first time at which a voltage is provided to a bit line BL based on the first power supply voltage VINTA1, and a second time at which a pre-charge command PRE is received. A capacitor 330 included in a memory cell 320 corresponding to the access address may be charged by the first power supply voltage VINTA1. The sense amplifier 100 may include a first sense amplifier unit 110 and a second sense amplifier unit 130. As used herein, a "unit" may refer to a "circuit." For example, data included in the memory cell 320 may be 1. If the word line WL is enabled, a turn-on voltage may be applied to a gate of a transistor 310 corresponding to the word line WL. If the turn-on voltage is applied to the gate of the transistor 310 corresponding to the word line WL, charges that are stored in the capacitor 330 included in the memory cell 320 may be provided to the sense amplifier 100 through the bit line BL. For example, a voltage of the complementary bit line BLB may be a reference voltage VREF. A voltage level of the reference voltage VREF may be half the first power supply voltage VINTA1. The voltage of the bit line BL may be greater than the reference voltage VREF. If the voltage of the complementary bit line BLB is the reference voltage VREF, a voltage of a first node N1 may transition to the first power supply voltage VINTA1 by turning-on the PMOS transistor included in the second sense amplifier unit 130. In one embodiment, the voltage of the first node N1 may have a certain voltage level based on the first power supply voltage VINTA1. If the voltage of the bit line BL is greater than the reference voltage VREF, a voltage of a second node N2 may transition to a ground voltage VSS by turning-on the NMOS transistor included in the first sense amplifier unit 110. The voltage of the first node N1 may be the voltage of the bit line BL and the voltage of the second node N2 may be the voltage of the complementary bit line BLB.

A second power supply voltage VINTA2 is provided to the sense amplifier 100 based on a second control signal CS2 during a second time interval T2. The second time interval T2 may be between the second time at which a voltage is provided to the first bit line based on the second power supply voltage VINTA2, and a third time at which the word line corresponding to the received address is disabled (S500). In one embodiment, a voltage level of the second power supply voltage VINTA2 is greater than a voltage level of the first power supply voltage VINTA1. The word line WL may be enabled even after the pre-charge command PRE is received. If the second power supply voltage VINTA2 is provided to the sense amplifier 100 during the second time interval T2, the voltage of the first node N1 may transition from the first power supply voltage VINTA1 to the second power supply voltage VINTA2. In one embodiment, the voltage of the first node N1 may have a certain voltage level based on the second power supply voltage VINTA2. As a result, the capacitor 330 included in the memory cell 320 may be restored to the second power supply voltage VINTA2 that is greater than the first power supply voltage VINTA1. The memory cell 320 that is restored to the second power supply voltage VINTA2 may store the data longer than the memory cell 320 that is restored to the first power supply voltage VINTA1.

The memory cell 320 corresponding to the access address is restored based on the first power supply voltage VINTA1 and the second power supply voltage VINTA2 (S700). For example, during the first time interval T1, the memory cell 320 corresponding to the access address may be restored using the first power supply voltage VINTA1. During the second time interval T2, the memory cell 320 corresponding to the access address may be restored using the second power supply voltage VINTA2. During the first time interval T1, a write operation in a memory cell 320 may be performed. The data included in the memory cell 320 may be changed from '0' to '1' during the first time interval T1 by column selection transistors 501 and 502. The column selection transistors 501 and 502 may be activated in response to the column selection signal CSL generated from a column decoder 270 of FIG. 4. When the data included in the memory cell 320 is changed from '0' to '1' during the first time interval T1, if the first power supply voltage VINTA1 is used as the power supply voltage of the sense amplifier 100, a time interval for which the capacitor 330 included in the memory cell 320 is charged to the first power supply voltage VINTA1 may be short. However, when the data included in the memory cell 320 is changed from '0' to '1' during the first time interval T1, if the second power supply voltage VINTA2 is used as the power supply voltage of the sense amplifier 100, a time interval for which the capacitor 330 included in the memory cell 320 is charged to the second power supply voltage VINTA2 may be longer than using the first power supply voltage VINTA1. Therefore, if the second power supply voltage VINTA2 is used as the power supply voltage of the sense amplifier 100 during the first time interval T1, the error may be generated in the data written in the memory cell 320. Therefore, the first power supply voltage VINTA1 may be used as the power supply voltage of the sense amplifier 100 during the first time interval T1 and the second power supply voltage VINTA2 may be used as the power supply voltage of the sense amplifier 100 during the second time interval T2. During the second time interval T2, the write operation of the memory device may not be performed.

A method of operating a memory device according to example embodiments may be capable of increasing a performance by restoring a memory cell 320 based on a second power supply voltage VINTA2 that is greater than a first power supply voltage VINTA1 during a second time interval T2, at which the word line WL is enabled after the pre-charge command PRE is received.

Figure 4:
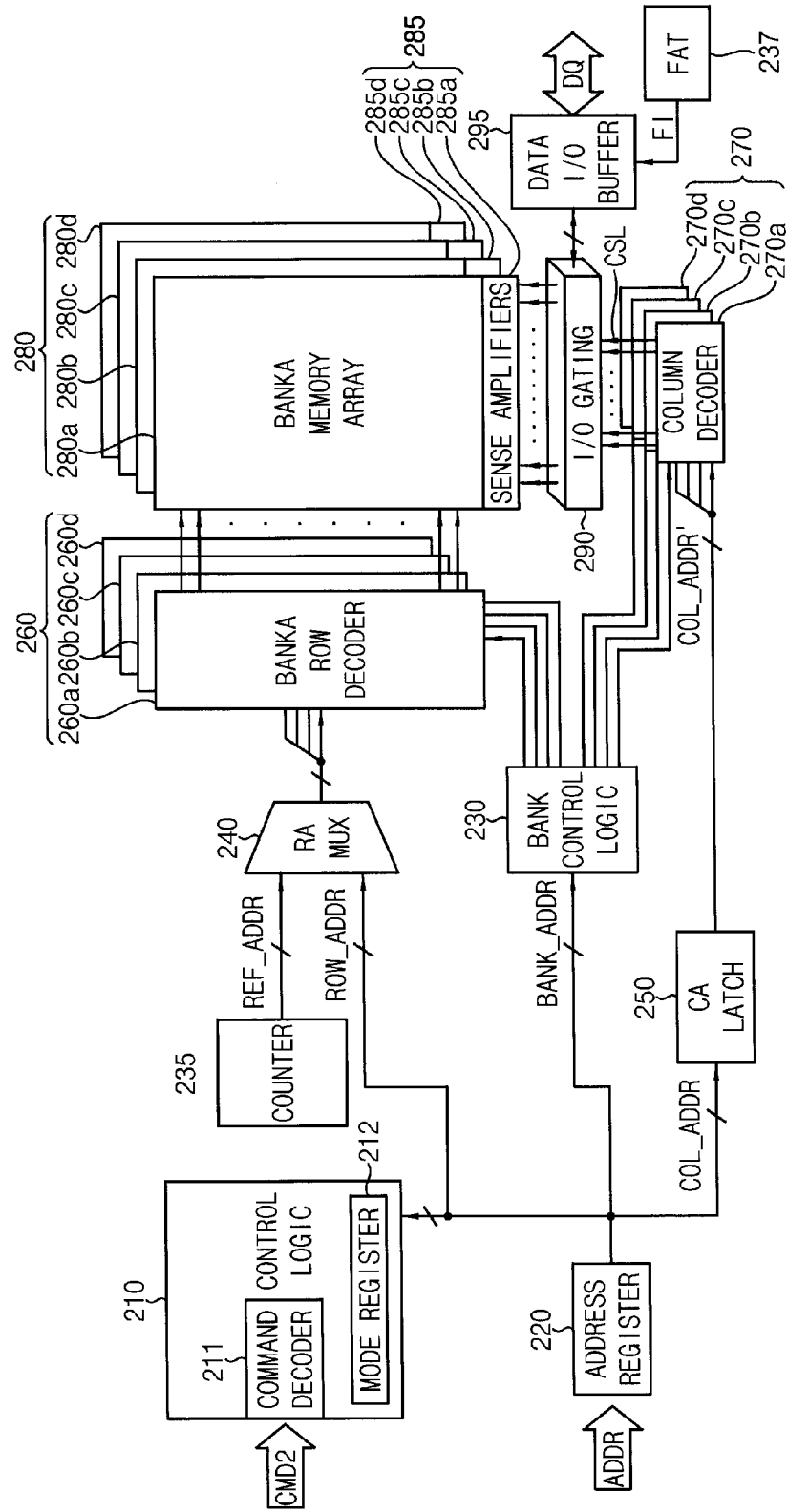
FIG. 4 is a block diagram illustrating the memory device according to example embodiments.

FIG. 4 is a block diagram illustrating the memory device according to example embodiments.

Referring to FIG. 4, the main memory 200 includes a control logic 210, an address register 220, a bank control logic 230, a row address multiplexer 240, a refresh counter 235, a fail address table 237, a column address latch 250, a row decoder 260, a column decoder 270, a memory cell array 280, a sense amplifier unit 285, an input/output gating circuit 290 and a data input/output buffer 295. In some embodiments, the memory device 200 may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc.

The memory cell array 280 may include first through fourth bank arrays 280a, 280b, 280c and 280d. The row decoder 260 may include first through fourth bank row decoders 260a, 260b, 260c and 260d respectively coupled to the first through fourth bank arrays 280a, 280b, 280c and 280d, the column decoder 270 may include first through fourth bank column decoders 270a, 270b, 270c and 270d respectively coupled to the first through fourth bank arrays 280a, 280b, 280c and 280d, and the sense amplifier unit 285 may include first through fourth bank sense amplifiers 285a, 285b, 285c and 285d respectively coupled to the first through fourth bank arrays 280a, 280b, 280c and 280d. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks. Although the main memory 200 is illustrated in FIG. 4 as including four banks, the main memory 200 may include any number of banks.

The address register 220 may receive an address ADDR including a bank address BANK_ADDR, a row address ROW_ADDR and a column address COL_ADDR from a memory controller (not illustrated). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh row address REF_ADDR from the refresh counter 235. The row address multiplexer 240 may selectively output the row address ROW_ADDR or the refresh row address REF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a word line corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. In some embodiments, in a burst mode, the column address latch 250 may generate column addresses COL_ADDR' that increment from the received column address COL_ADDR. The column address latch 250 may apply the temporarily stored or generated column address COL_ADDR' to the first through fourth bank column decoders 270a, 270b, 270c and 270d.

The activated one of the first through fourth bank column decoders 270a, 270b, 270c and 270d may decode the column address COL_ADDR' output from the column address latch 250, and may control the input/output gating circuit 290 to output data corresponding to the column address COL_ADDR'. The activated one of the first through fourth bank column decoders 270a, 270b, 270c and 270d may output a column selection signal CSL to read data from or write data in one or more memory cell of the first through fourth bank arrays 280a, 280b, 280c and 280d.

The input/output gating circuit 290 may include circuitry for gating input/output data. The input/output gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array, and may be stored in the read data latches. The data DQ stored in the read data latches may be provided to the memory controller via the data input/output buffer 295. Data DQ to be written to one bank array of the first through fourth bank arrays 280a, 280b, 280c and 280d may be provide from the memory controller to the data input/output buffer 295. The data DQ provided to the data input/output buffer 295 may be written to the one array bank via the write drivers.

The control logic 210 may control operations of the memory device 200. For example, the control logic 210 may generate control signals for the memory device 200 to perform a write operation or a read operation. The control logic 210 may include a command decoder 211 that decodes a command CMD received from the memory controller and a mode register 212 that sets an operation mode of the memory device 200. For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may further receive a clock signal (CLK) and a clock enable signal (/CKE) for operating the memory device 200 in a synchronous manner. In addition, in an embodiment of the present disclosure, a three-dimensional (3D) memory array is provided in the memory device 200. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 5:
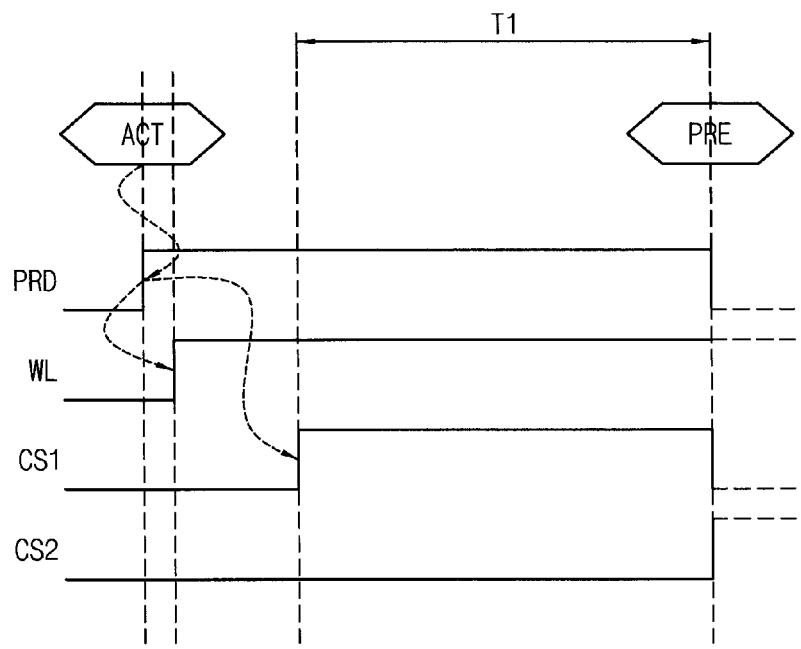
FIG. 5 is a timing diagram illustrating a first control signal and a second control signal provided to the sense amplifier of FIG. 3 during a first time interval, according to example embodiments.

FIG. 5 is a timing diagram illustrating a first control signal and a second control signal provided to the sense amplifier of FIG. 3 during a first time interval, according to example embodiments.

Referring to FIG. 5, when the active command ACT is received, a row enable signal PRD may be enabled. If the row enable signal PRD is enabled, the word line WL corresponding to the access address may be enabled. The first time interval T1 is between a first time at which a voltage is provided to a bit line BL based on the first power supply voltage VINTA1, and a second time at which the pre-charge command PRE is received.

In an example embodiment, during the first time interval T1, the first control signal CS1 may be a first logic level and the second control signal CS2 may be a second logic level opposite to the first logic level. For example, the first logic level may be a logic high level and the second logic level may be a logic low level. When the first control signal CS1 is the first logic level during the first time interval T1, the first power transistor 150 (e.g., an N-type transistor) may be turned-on. When the first power transistor 150 is turned on, the first power supply voltage VINTA1 may be provided to the sense amplifier 100 through the first power transistor 150. Also, when the second control signal CS2 is the second logic level during the first time interval T1, the second power transistor 170 may be turned-off. When the second power transistor 170 is turned-off, the second power supply voltage VINTA2 may not be provided to the sense amplifier 100 through the second power transistor 170. Therefore, during the first time interval T1, the power supply voltage provided to the sense amplifier 100 may be the first power supply voltage VINTA1. In one embodiment, a voltage level of the first logic level of the first control signal CS1 may be greater than a voltage level of the first power supply voltage VINTA1 for providing the first power supply voltage VINTA1 to the N1 node of the sense amplifier 100. Also, a voltage level of the first logic level of the second control signal CS2 may be greater than a voltage level of the second power supply voltage VINTA2 for providing the second power supply voltage VINTA2 to the N1 node of the sense amplifier 100.

In an example embodiment, each of the first and second power transistors 150 and 170 may be a P-type transistor. In this case, during the first time interval T1, the first control signal CS1 may be the second logic level and the second control signal CS2 may be the first logic level. When the first control signal CS1 is the second logic level during the first time interval T1, the first power transistor 150 (e.g., a P-type transistor) may be turned-on. When the first power transistor 150 is turned on, the first power supply voltage VINTA1 may be provided to the sense amplifier 100 through the first power transistor 150. Also, when the second control signal CS2 is the first logic level during the first time interval T1, the second power transistor 170 (e.g., a P-type transistor) may be turned-off.

During the first time interval T1, the write operation in the memory cell 320 may be performed. The data included in the memory cell 320 may be changed from '0' to '1' during the first time interval T1 according to the write operation. When the data included in the memory cell 320 is changed from '0' to '1' during the first time interval T1, if the first power supply voltage VINTA1 is used as the power supply voltage of the sense amplifier 100, a time interval for which the capacitor 330 included in the memory cell 320 is charged to the first power supply voltage VINTA1 may be short. However, when the data included in the memory cell 320 is changed from '0' to '1' during the first time interval T1, if the second power supply voltage VINTA2 is used as the power supply voltage of the sense amplifier 100, a time interval for which the capacitor 330 included in the memory cell 320 is charged to the second power supply voltage VINTA2 may be longer than using the first power supply voltage VINTA1. Therefore, if the second power supply voltage VINTA2 is used as the power supply voltage of the sense amplifier 100, the error may be generated in the data written in the memory cell 320. Therefore the first power supply voltage VINTA1 may be used as the power supply voltage of the sense amplifier 100 during the first time interval T1.

Figure 6:
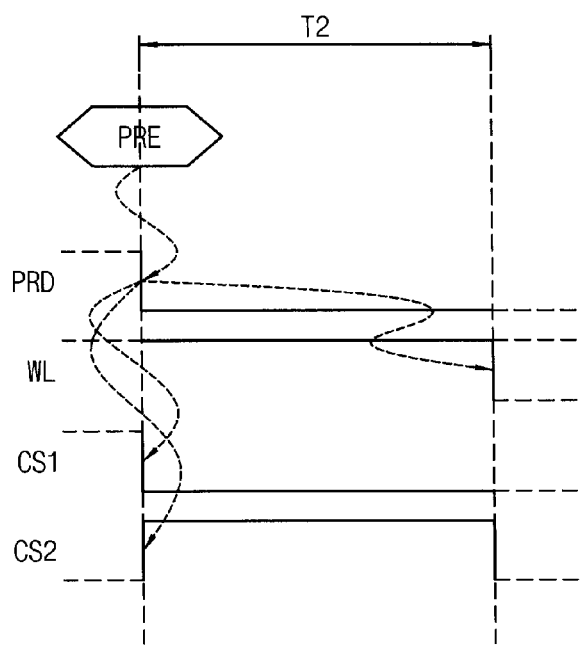
FIG. 6 is a timing diagram illustrating a first control signal and a second control signal provided to the sense amplifier of FIG. 3 during a second time interval, according to example embodiments.

FIG. 6 is a timing diagram illustrating a first control signal and a second control signal provided to the sense amplifier of FIG. 3 during a second time interval, according to example embodiments.

Referring to FIG. 6, the second power supply voltage VINTA2 is provided to the sense amplifier 100 based on a second control signal CS2 during a second time interval T2, at which the word line WL is enabled after the pre-charge command PRE is received. The word line WL may be enabled even after receiving the pre-charge command PRE.

In an example embodiment, during the second time interval T2, the first control signal CS1 may be the second logic level and the second control signal CS2 may be the first logic level. For example, the first control signal CS1 may be the second logic level during the second time interval T2.

When the first control signal CS1 is the second logic level during the second time interval T2, the first power transistor 150 (e.g., an N-type transistor) may be turned-off. When the first power transistor 150 is turned-off, the first power supply voltage VINTA1 may not be provided to the sense amplifier 100 through the first power transistor 150. Also, when the second control signal CS2 is the first logic level during the second time interval T2, the second power transistor 170 (e.g., an N-type transistor) may be turned-on. When the second power transistor 170 is turned-on, the second power supply voltage VINTA2 may be provided to the sense amplifier 100 through the second power transistor 170. Therefore, during the second time interval T2, the power supply voltage provided to the sense amplifier 100 may be the second power supply voltage VINTA2.

Figure 7:
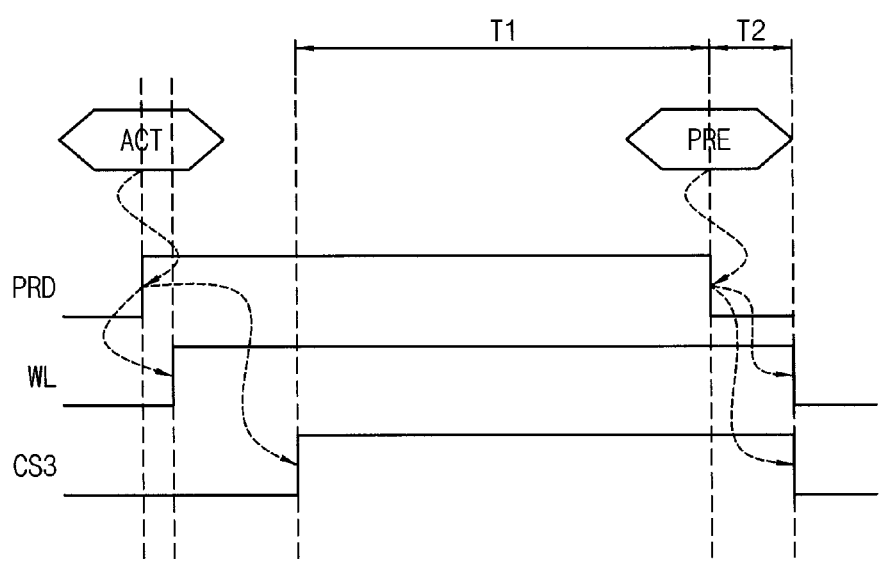
FIG. 7 is a timing diagram illustrating a third control signal provided to the sense amplifier of FIG. 3 during a first time interval and a second time interval, according to example embodiments.

FIG. 7 is a timing diagram illustrating a third control signal provided to the sense amplifier of FIG. 3 during a first time interval and a second time interval, according to example embodiments.

Referring to FIG. 7, when the active command ACT is received, a row enable signal PRD may be enabled. If the row enable signal PRD is enabled, the word line WL corresponding to the access address may be enabled. The first time interval T1 is between a first time at which a voltage is provided to a bit line BL, and a second time at which the pre-charge command PRE is received. A second time interval T2 may be a time interval while the word line WL is enabled after the pre-charge command PRE is received.

In an example embodiment, a ground voltage VSS provided to the sense amplifier 100 may be provided based on a third control signal CS3. During the first time interval T1 and the second time interval T2, the third control signal CS3 may be a first logic level. To operate the sense amplifier 100, the ground voltage VSS and the power supply voltage may be provided to the sense amplifier 100 during the first time interval T1 and the second time interval T2. The first power supply voltage VINTA1 provided to the sense amplifier 100 during the first time interval T1 may be determined based on the first control signal CS1. The second power supply voltage VINTA2 provided to the sense amplifier 100 during the second time interval T2 may be determined based on the second control signal CS2. The ground voltage VSS provided to the sense amplifier 100 during the first time interval T1 and the second time interval T2 may be determined based on the third control signal CS3. The third control signal CS3 may be enabled during the first time interval T1 and the second time interval T2. When the third control signal CS3 is enabled during the first time interval T1 and the second time interval T2, a ground voltage VSS may be provided to the sense amplifier 100 through a ground transistor 190.

Figure 8:
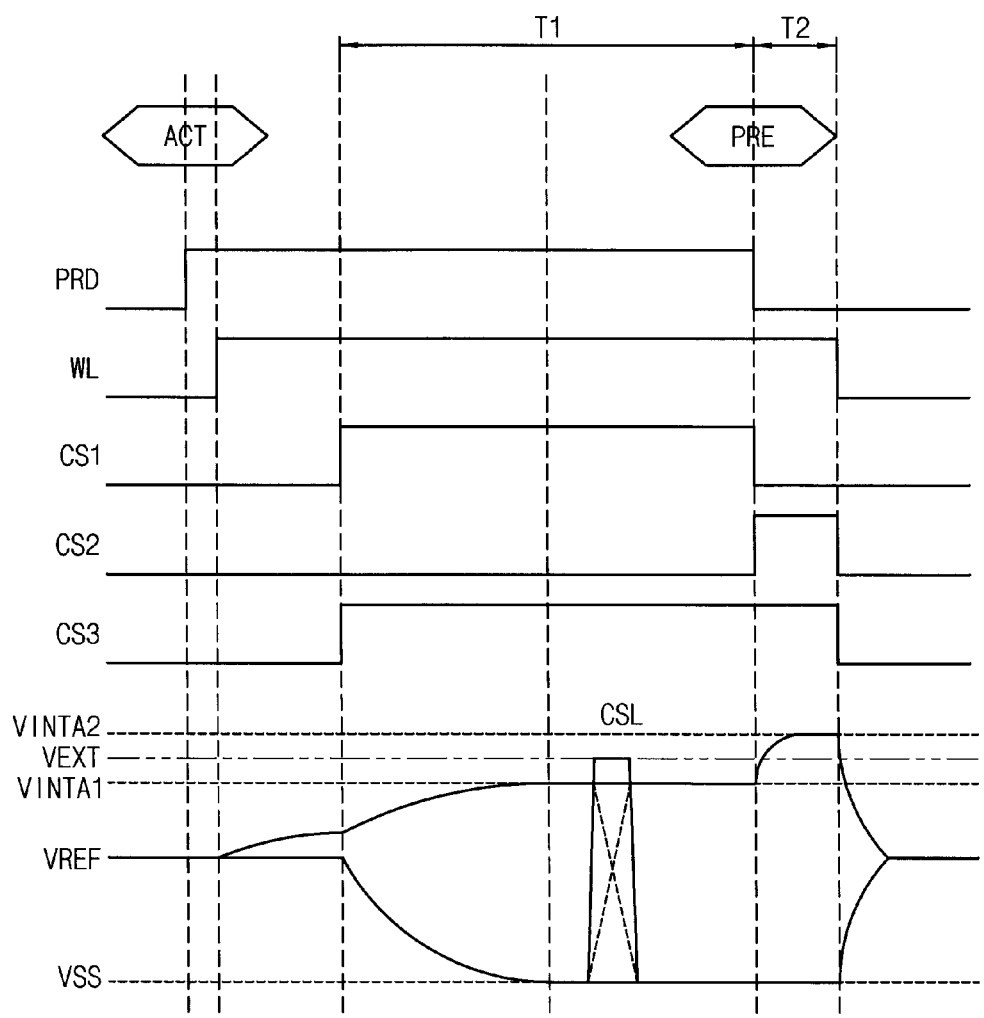
FIG. 8 is a timing diagram for describing an operation of a sense amplifier included in a memory device according to an example embodiment.
Figure 9:
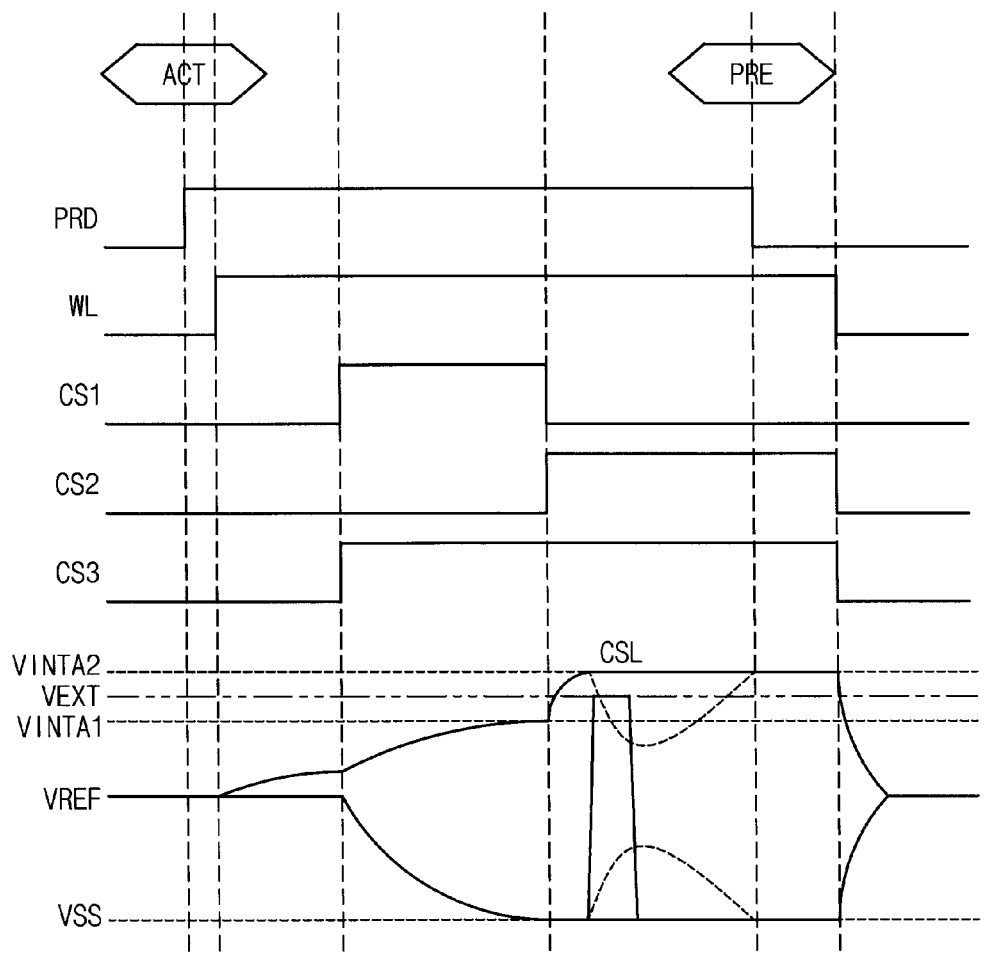
FIG. 9 is a timing diagram for describing an operation example of a sense amplifier included in a memory device.

FIG. 8 is a timing diagram for describing an operation of a sense amplifier included in a memory device according to an example embodiment. FIG. 9 is a timing diagram for describing an operation example of a sense amplifier included in a memory device.

Referring to FIGS. 8 and 9, when the active command ACT is received, a row enable signal PRD may be enabled. If the row enable signal PRD is enabled, the word line WL corresponding to the access address may be enabled.

The sense amplifier 100 may include a first sense amplifier unit 110 and a second sense amplifier unit 130. For example, data included in the memory cell 320 may be 1. If the word line WL is enabled, the turn-on voltage may be applied to a gate of a transistor 310 corresponding to the word line WL. If the turn-on voltage is applied to the gate of the transistor 310 corresponding to the word line WL, charges that are stored in a capacitor 330 included in the memory cell 320 may be provided to the sense amplifier 100 through the bit line BL. For example, a voltage of the complementary bit line BLB may be a reference voltage VREF. The voltage of the bit line BL may be greater than the reference voltage VREF. If the voltage of the complementary bit line BLB is the reference voltage VREF, a voltage of the first node N1 may transition to a first power supply voltage VINTA1 by turning-on the PMOS transistor included in the second sense amplifier unit 130. If the voltage of the bit line BL is greater than the reference voltage VREF, a voltage of a second node N2 may transition to a ground voltage VSS by turning-on the NMOS transistor included in the first sense amplifier unit 110. The voltage of the first node N1 may be the voltage of the bit line BL and the voltage of the second node N2 may be the voltage of the complementary bit line BLB. A first power supply voltage VINTA1 is provided to a sense amplifier 100 based on a first control signal CS1 during a first time interval T1. The first time interval T1 is between a first time at which a voltage is provided to a bit line BL based on the first power supply voltage VINTA1, and a second time at which the pre-charge command PRE is received. The provided voltage is charged in a memory cell 320 corresponding to the access address. Starting at the first time the voltage applied to the bit line BL increases to the first power supply voltage VINTA1 or a certain voltage level.

A second power supply voltage VINTA2 is provided to the sense amplifier 100 based on a second control signal CS2 during a second time interval T2, while which the word line WL is enabled after the pre-charge command PRE is received. The word line WL may be enabled even after receiving the pre-charge command PRE. If the second power supply voltage VINTA2 is provided to the sense amplifier 100 during the second time interval T2, the voltage of the first node N1 may transition from the first power supply voltage VINTA1 to the second power supply voltage VINTA2. As a result, the capacitor 330 included in the memory cell 320 may be restored to the second power supply voltage VINTA2 that is greater than the first power supply voltage VINTA1. An external power supply voltage VEXT may be provided to several circuits of the memory device from a memory controller (not shown). The external power supply voltage VEXT may be greater than the first power supply voltage VINTA1 and less than the second power supply voltage VINTA2. The memory cell 320 that is restored to the second power supply voltage VINTA2 may store the data longer than the memory cell 320 that is restored to the first power supply voltage VINTA1.

The memory cell 320 corresponding to the access address may be restored based on the first power supply voltage VINTA1 and the second power supply voltage VINTA2. For example, during the first time interval T1, the memory cell 320 corresponding to the access address may be restored using the first power supply voltage VINTA1. During the second time interval T2, the memory cell 320 corresponding to the access address may be restored using the second power supply voltage VINTA2. During the first time interval T1, the write operation in the memory cell 320 may be performed. The data included in the memory cell 320 may be changed from '0' to '1' during the first time interval T1 by column selection transistors 501 and 502. The column selection transistors 501 and 502 may be activated in response to the column selection signal CSL generated from the column decoder 270 of FIG. 4. When the data included in the memory cell 320 is changed from '0' to '1' during the first time interval T1, if the first power supply voltage VINTA1 is used as the power supply voltage of the sense amplifier 100, a time interval for which the capacitor 330 included in the memory cell 320 is charged to the first power supply voltage VINTA1 may be short. However, when the data included in the memory cell 320 is changed from '0' to '1' during the first time interval T1, if the second power supply voltage VINTA2 is used as the power supply voltage of the sense amplifier 100, a time interval for which the capacitor 330 included in the memory cell 320 is charged to the second power supply voltage VINTA2 may be longer than using the first power supply voltage VINTA1. Therefore, if the second power supply voltage VINTA2 is used as the power supply voltage of the sense amplifier 100 during the first time interval T1, the error may be generated in the data written in the memory cell 320. Therefore the first power supply voltage VINTA1 may be used as the power supply voltage of the sense amplifier 100 during the first time interval T1 and the second power supply voltage VINTA2 may be used as the power supply voltage of the sense amplifier 100 during the second time interval T2.

In an example embodiment, during the first time interval T1, the sense amplifier 100 may pre-charge a bit line BL and a complementary bit line BLB based on the first power supply voltage VINTA1 and a ground voltage VSS. During the second time interval T2, the sense amplifier 100 may pre-charge the bit line BL and the complementary bit line BLB based on the second power supply voltage VINTA2 and the ground voltage VSS.

A method of operating a memory device according to example embodiments may be capable of increasing a performance by restoring a memory cell 320 based on a second power supply voltage VINTA2 that is greater than a first power supply voltage VINTA1 during a second time interval T2, while the word line WL is enabled after the pre-charge command PRE is received.

Figure 10:
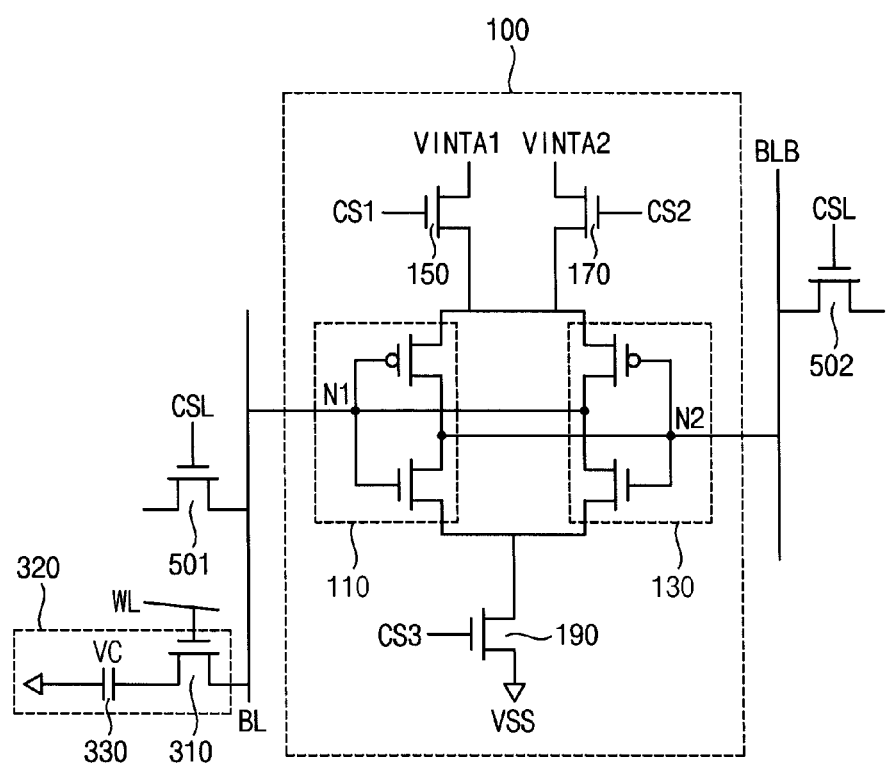
FIG. 10 is a circuit diagram illustrating a sense amplifier and a memory cell included in the memory device of FIG. 4 according to example embodiments.
Figure 11:
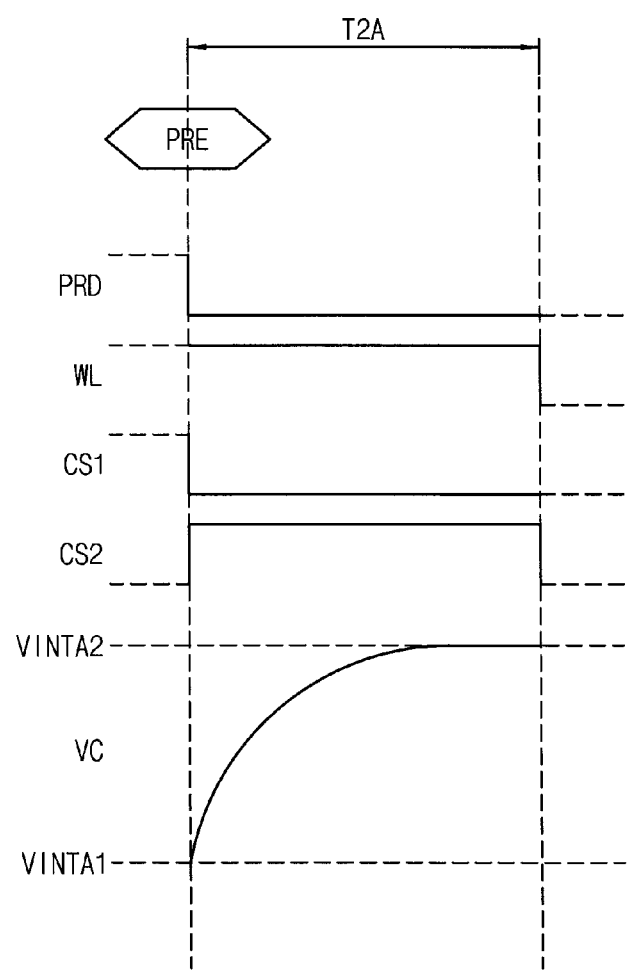
FIGS. 11 and 12 are timing diagrams illustrating a capacitor voltage that is changed as a second time interval is changed, according to example embodiments.
Figure 12:
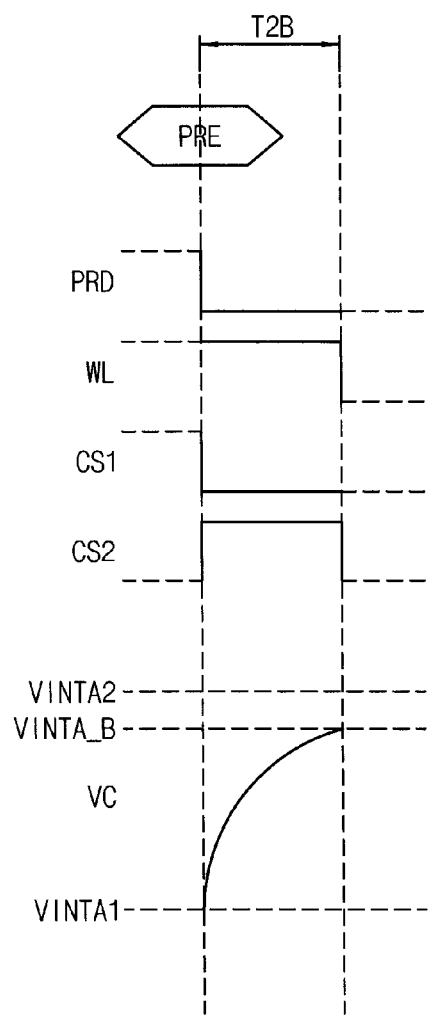

FIG. 10 is a circuit diagram illustrating a sense amplifier and a memory cell included in the memory device of FIG. 4 according to example embodiments. FIGS. 11 and 12 are timing diagrams illustrating a capacitor voltage that is changed as a second time interval is changed, according to example embodiments.

Referring to FIGS. 10 to 12, the sense amplifier 100 may include a first sense amplifier unit 110, a second sense amplifier unit 130, a first power transistor 150, a second power transistor 170 and a ground transistor 190. The memory cell 320 may include a transistor 310 and a capacitor 330. During the second time interval T2, the first power transistor 150 may be turned-off based on the first control signal CS1. If the first power transistor 150 is turned-off based on the first control signal CS1, the first power supply voltage VINTA1 may not be provided to the sense amplifier 100 through the first power transistor 150. During the second time interval T2, the second power transistor 170 may be turned-on based on the second control signal CS2. If the second power transistor 170 is turned-on based on the second control signal CS2, the second power supply voltage VINTA2 may be provided to the sense amplifier 100 through the second power transistor 170.

In an example embodiment, a capacitor voltage VC of the memory cell 320 corresponding to the access address may be determined based on the second time interval T2. The capacitor voltage VC may be increased as the second time interval T2 is increased. For example, the second time interval T2 of FIG. 8 may be a time interval T2A. During the time interval T2A, the voltage of the bit line BL may transition from the first power supply voltage VINTA1 to the second power supply voltage VINTA2. Therefore when the second time interval T2 is the time interval T2A, the capacitor 330 included in the memory cell 320 may be restored to the second power supply voltage VINTA2 that is greater than the first power supply voltage VINTA1. In one embodiment, the second time interval T2 may be a time interval T2B. The time interval T2B may be less than the time interval T2A. When the second time interval T2 is the time interval T2B, the voltage of the bit line BL may not transition from the first power supply voltage VINTA1 to the second power supply voltage VINTA2 because the second time interval T2 is short. Therefore when the second time interval T2 is the time interval T2B, the capacitor 330 included in the memory cell 320 may be restored to the voltage that is greater than the first power supply voltage VINTA1 and less than the second power supply voltage VINTA2. Therefore the capacitor voltage VC of the memory cell 320 corresponding to the access address may be determined based on the second time interval T2.

Figure 13:
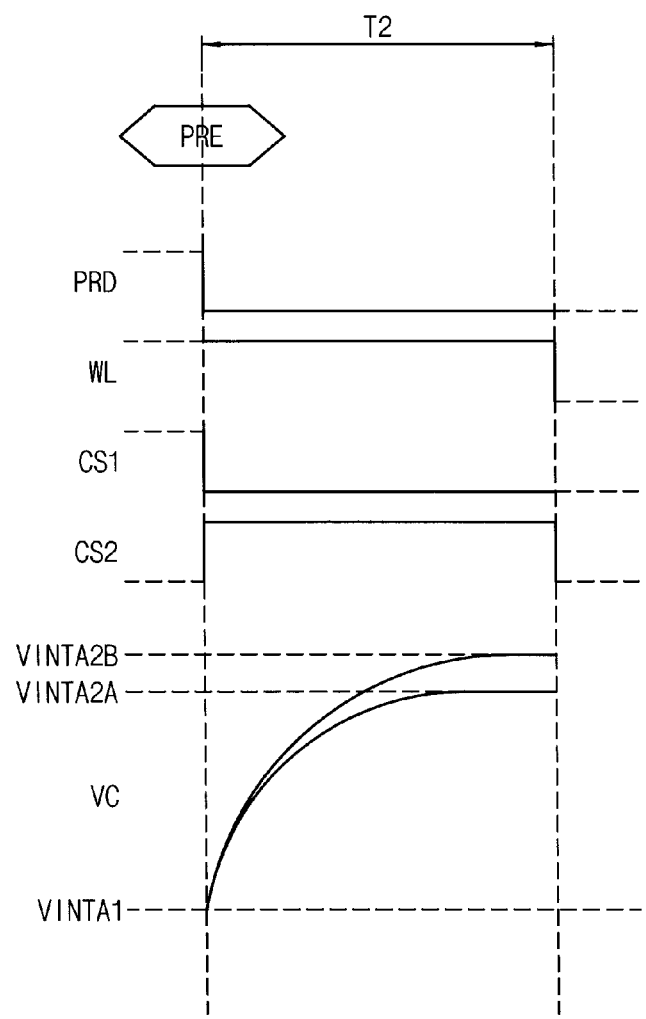
FIG. 13 is a timing diagram illustrating a capacitor voltage that is changed as a second power supply voltage is changed, according to example embodiments.

FIG. 13 is a timing diagram illustrating a capacitor voltage that is changed as a second power supply voltage VINTA2 is changed, according to example embodiments.

Referring to FIG. 13, during the second time interval T2, the first power transistor 150 may be turned-off based on the first control signal CS1. If the first power transistor 150 is turned-off based on the first control signal CS1, the first power supply voltage VINTA1 may not be provided to the sense amplifier 100 through the first power transistor 150. During the second time interval T2, the second power transistor 170 may be turned-on based on the second control signal CS2. If the second power transistor 170 is turned-on based on the second control signal CS2, the second power supply voltage VINTA2 may be provided to the sense amplifier 100 through the second power transistor 170.

In an example embodiment, a capacitor voltage VC of the memory cell 320 corresponding to the access address may be determined based on the second power supply voltage VINTA2. The capacitor voltage VC may be increased as the second power supply voltage VINTA2 is increased. In one embodiment, the second power supply voltage VINTA2 may be a first level VINTA2A. When the second power supply voltage VINTA2 is the first level VINTA2A, the voltage of the bit line BL may transition from the first power supply voltage VINTA1 to the first level VINTA2A that is the second power supply voltage VINTA2 during the second time interval T2. Therefore when the second power supply voltage VINTA2 is the first level VINTA2A, the capacitor 330 included in the memory cell 320 may be restored to the first level VINTA2A that is greater than the first power supply voltage VINTA1. In one embodiment, the second power supply voltage VINTA2 may be a second level VINTA2B. When the second power supply voltage VINTA2 is the second level VINTA2B, the voltage of the bit line BL may transition from the first power supply voltage VINTA1 to the second level VINTA2B that is the second power supply voltage VINTA2 during the second time interval T2. Therefore when the second power supply voltage VINTA2 is the second level VINTA2B, the capacitor 330 included in the memory cell 320 may be restored to the second level VINTA2B that is greater than the first power supply voltage VINTA1. Therefore the capacitor voltage VC of the memory cell 320 corresponding to the access address may be determined based on the second power supply voltage VINTA2.

Figure 14:
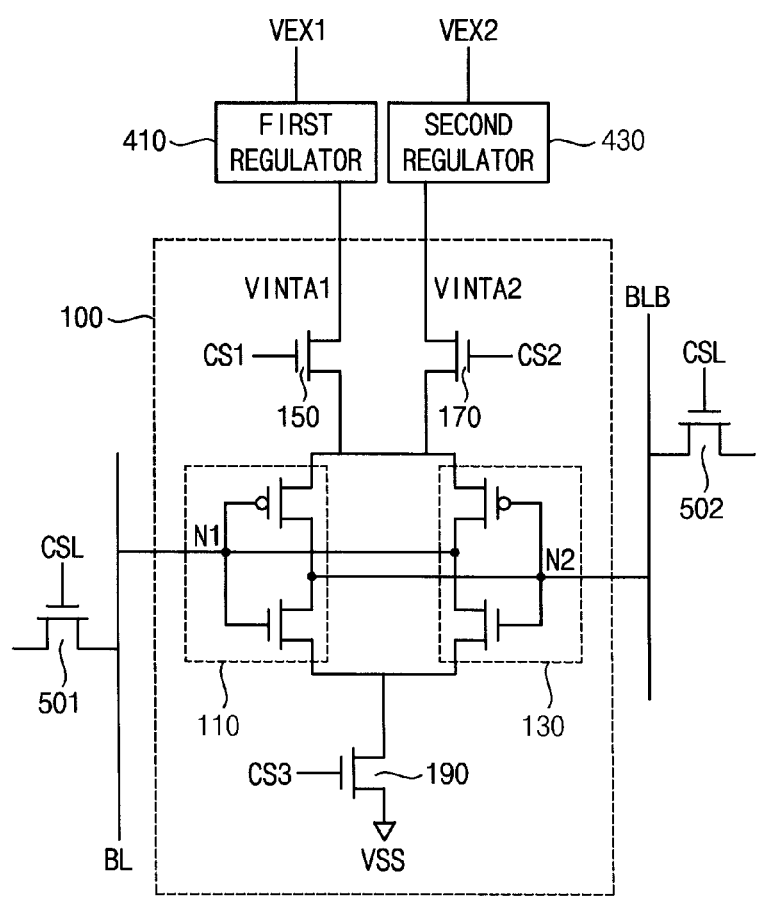
FIG. 14 is a diagram illustrating a method of generating a first power supply voltage and a second power supply voltage, according to example embodiments.

FIG. 14 is a diagram illustrating a method of generating a first power supply voltage and a second power supply voltage, according to example embodiments.

Referring to FIG. 14, the first power supply voltage VINTA1 may be generated by regulating a first external power supply voltage VEX1 using a first regulator 410. The second power supply voltage VINTA2 may be generated by regulating a second external power supply voltage VEX2 using a second regulator 430. Thus, the second power supply voltage VINTA2 may be irrespective of the first power supply voltage VINTA1 and they may be independently provided. For example, a voltage level of the second power supply voltage VINTA2 may be greater than a voltage level of the first power supply voltage VINTA1. The first and second external power supply voltages VEX1 and VEX2 may be provided from outside the memory device. A voltage level of the first external power supply voltage VEX1 may be less than the voltage level of the first power supply voltage VINTA1, and a voltage level of the second external power supply voltage VEX2 may be less than the voltage level of the second power supply voltage VINTA2 and greater than the voltage level of the first external power supply voltage VEX1.

For example, the first control signal CS1 may be a first logic level and the second control signal CS2 may be a second logic level. The first logic level may be a logic high level and the second logic level may be a logic low level. When the first control signal CS1 is the first logic level during the first time interval T1, the first power transistor 150 may be turned-on. When the first power transistor 150 is turned-on, the first power supply voltage VINTA1 may be provided to the sense amplifier 100 through the first power transistor 150. The power supply voltage that is provided to the sense amplifier 100 during the first time interval T1 may be the first power supply voltage VINTA1 that is generated from the first regulator 410 using the first external power supply voltage VEX1. Also, when the second control signal CS2 is the first logic level during the second time interval T2, the second power transistor 170 may be turned-on. When the second power transistor 170 is turned-on, the second power supply voltage VINTA2 may be provided to the sense amplifier 100 through the second power transistor 170. The power supply voltage that is provided to the sense amplifier 100 during the second time interval T2 may be the second power supply voltage VINTA2 that is generated from the second regulator 430 using the second external power supply voltage VEX2.

Figure 15:
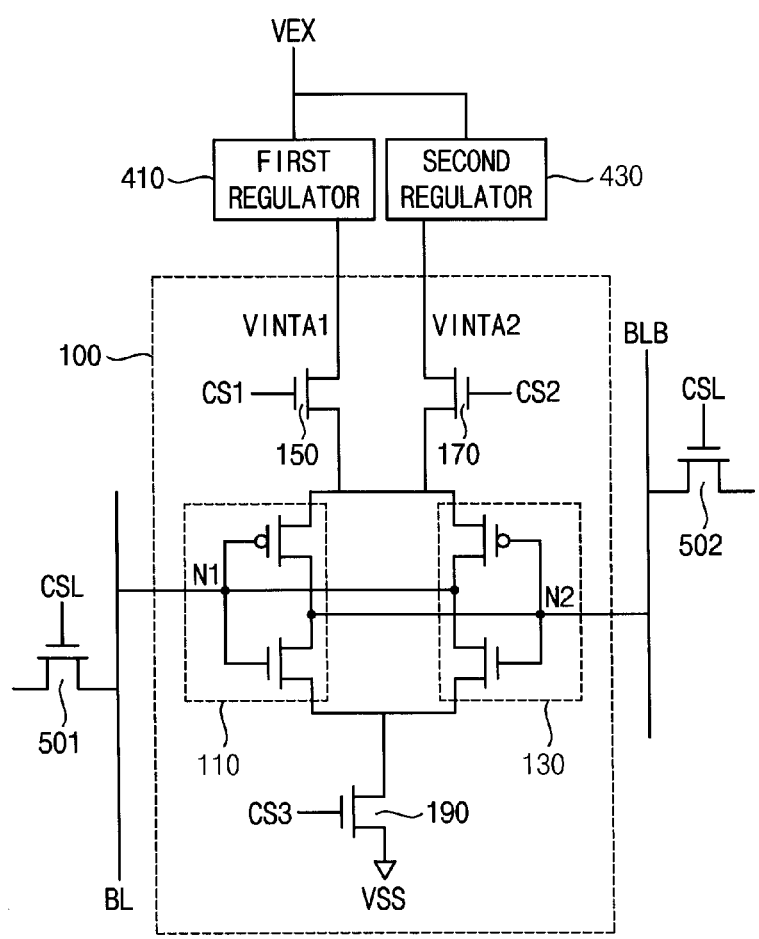
FIG. 15 is a diagram illustrating another method of generating a first power supply voltage and a second power supply voltage, according to example embodiments.

FIG. 15 is a diagram illustrating another method of generating a first power supply voltage and a second power supply voltage, according to example embodiments.

Referring to FIG. 15, the first power supply voltage VINTA1 may be generated by regulating an external power supply voltage VEX using a first regulator 410. The second power supply voltage VINTA2 may be generated by regulating the external power supply voltage VEX using a second regulator 430. Thus, the second power supply voltage VINTA2 may be irrespective of the first power supply voltage VINTA1. For example, the different power supply voltages may not depend on each other or be derived from each other. For example, the first control signal CS1 may be the first logic level during the first time interval T1. When the first control signal CS1 is the first logic level during the first time interval T1, the first power transistor 150 may be turned-on. When the first power transistor 150 is turned-on, the first power supply voltage VINTA1 may be provided to the sense amplifier 100 through the first power transistor 150. The power supply voltage that is provided to the sense amplifier 100 during the first time interval T1 may be the first power supply voltage VINTA1 that is generated from the first regulator 410 using the external power supply voltage VEX. Also, the second control signal CS2 may be the first logic level during the second time interval T2. When the second control signal CS2 is the first logic level during the second time interval T2, the second power transistor 170 may be turned-on. When the second power transistor 170 is turned-on, the second power supply voltage VINTA2 may be provided to the sense amplifier 100 through the second power transistor 170. The power supply voltage that is provided to the sense amplifier 100 during the second time interval T2 may be the second power supply voltage VINTA2 that is generated from the second regulator 430 using the external power supply voltage VEX. For example, a voltage level of the second power supply voltage VINTA2 may be greater than a voltage level of the first power supply voltage VINTA1. The external power supply voltage VEX may be provided from outside the memory device. For example, a voltage level of the external power supply voltage VEX may be greater than the first and second power supply voltages VINTA1 and VINTA2.

Figure 16:
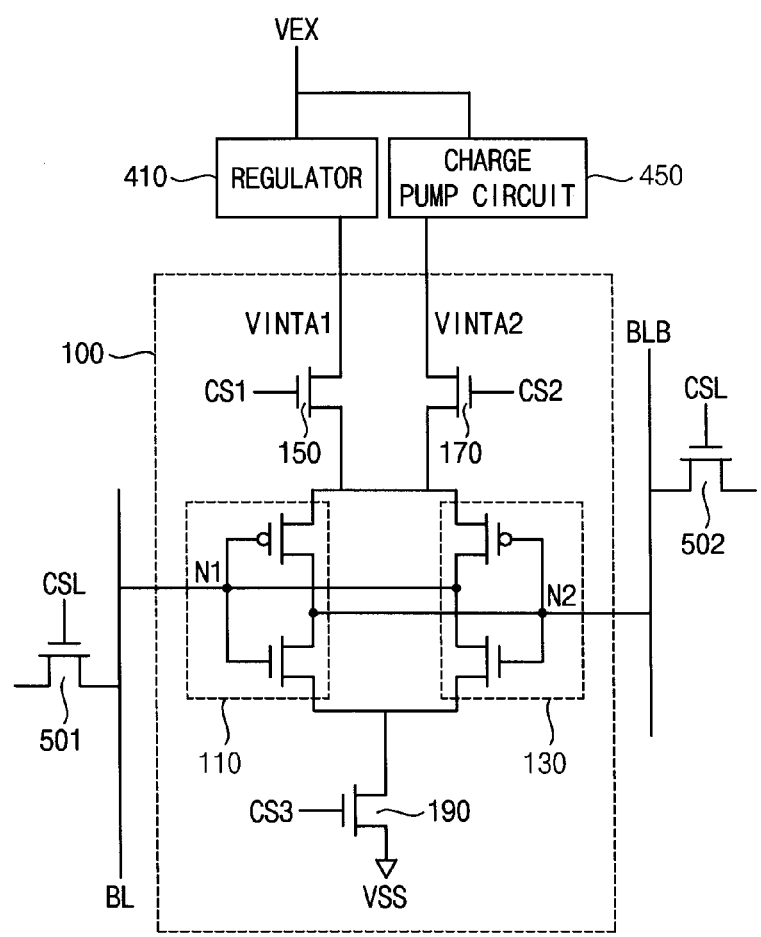
FIG. 16 is a diagram illustrating still another method of generating a first power supply voltage and a second power supply voltage, according to example embodiments.

FIG. 16 is a diagram illustrating still another method of generating a first power supply voltage and a second power supply voltage, according to example embodiments.

Referring to FIG. 16, the first power supply voltage VINTA1 may be generated by regulating an external power supply voltage VEX using a regulator 410. The second power supply voltage VINTA2 may be generated by boosting the external power supply voltage VEX using a charge pump circuit 450. Thus, the second power supply voltage VINTA2 may be irrespective of the first power supply voltage VINTA1. For example, the first control signal CS1 may be the first logic level during the first time interval T1. When the first control signal CS1 is the first logic level during the first time interval T1, the first power transistor 150 may be turned-on. When the first power transistor 150 is turned-on, the first power supply voltage VINTA1 that is generated from the first regulator 410 using the external power supply voltage VEX may be provided to the sense amplifier 100 through the first power transistor 150. The power supply voltage that is provided to the sense amplifier 100 during the first time interval T1 may be the first power supply voltage VINTA1 that is generated from the first regulator 410 using the external power supply voltage VEX. Also, the second control signal CS2 may be the first logic level during the second time interval T2. When the second control signal CS2 is the first logic level during the second time interval T2, the second power transistor 170 may be turned-on. When the second power transistor 170 is turned-on, the second power supply voltage VINTA2 that is generated from the charge pump circuit 450 using the external power supply voltage VEX may be provided to the sense amplifier 100 through the second power transistor 170. The power supply voltage that is provided to the sense amplifier 100 during the second time interval T2 may be the second power supply voltage VINTA2 that is generated from the charge pump circuit 450 using the external power supply voltage VEX. For example, a voltage level of the second power supply voltage VINTA2 may be greater than a voltage level of the first power supply voltage VINTA1. The external power supply voltage VEX may be provided from outside the memory device. For example, a voltage level of the external power supply voltage VEX may be greater than the first power supply voltages VINTA1.

Figure 17:
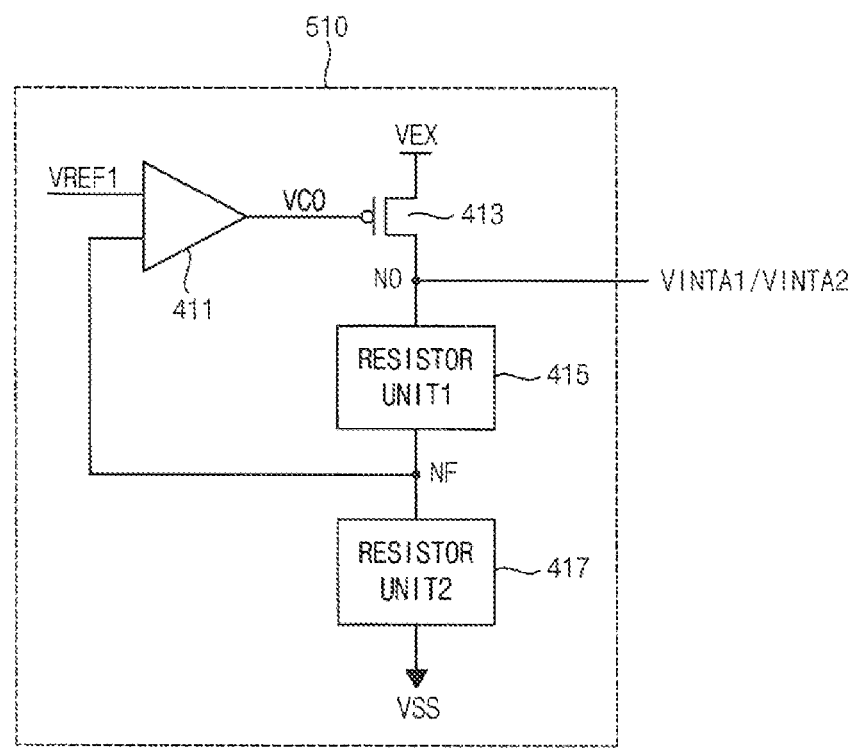
FIG. 17 is a diagram illustrating a regulator that generates a first power supply voltage and a second power supply voltage, according to example embodiments.
Figure 18:
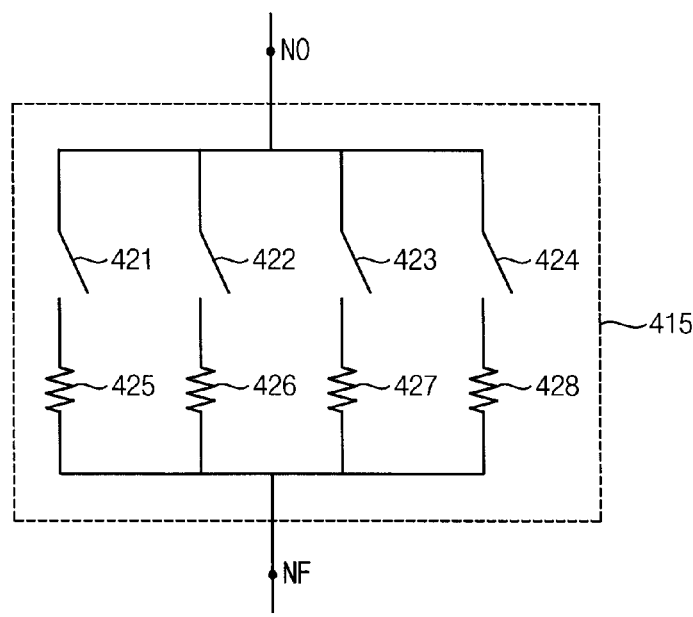
FIG. 18 is a circuit diagram illustrating a first resistor unit included in the regulator of FIG. 17 according to example embodiments.
Figure 19:
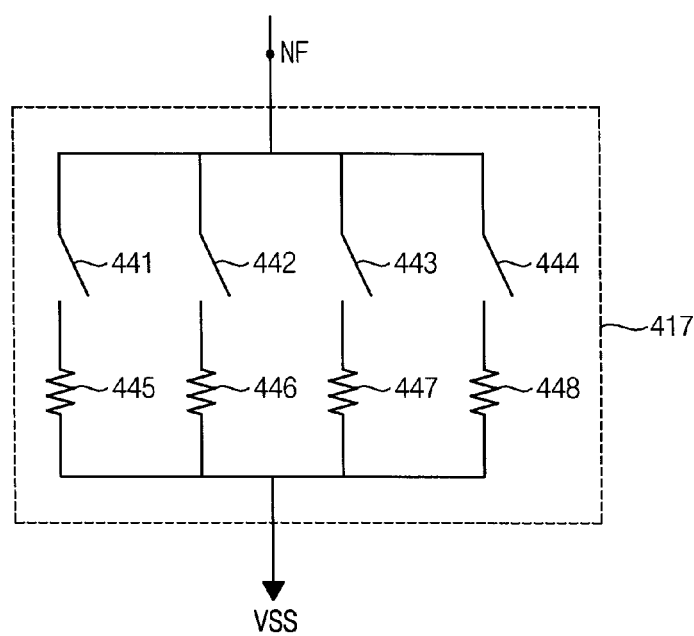
FIG. 19 is a circuit diagram illustrating a second resistor unit included in the regulator of FIG. 17 according to example embodiments.

FIG. 17 is a diagram illustrating a regulator that generates a first power supply voltage or a second power supply voltage VINTA2, according to example embodiments. FIG. 18 is a circuit diagram illustrating an example of a first resistor unit included in the regulator of FIG. 17 according to example embodiments. FIG. 19 is a circuit diagram illustrating an example of a second resistor unit included in the regulator of FIG. 17 according to example embodiments.

Referring to FIGS. 17 to 19, a regulator 510 may include a comparator 411, a control transistor 413, a first resistor unit 415 and a second resistor unit 417. The regulator 510 may be one of the regulators of FIGS. 14 to 16. The comparator 411 may generate a comparator output voltage VCO by comparing a reference voltage VREF1 and a voltage of a feedback node NF. The comparator output voltage VCO may be provided to a gate of the control transistor 413. The control transistor 413 may be turned-on based on the comparator output voltage VCO. The feedback node NF may be a node between the first resistor unit 415 and the second resistor unit 417. If the control transistor 413 is turned-on, the conduction path may be formed between an external voltage VEX and the output node NO. For example, the voltage of the output node NO may be controlled by controlling the resistance value of the first resistor unit 415 and the second resistor unit 417. For example, when the regulator 510 generates the first power supply voltage VINTA1 the reference voltage VREF1 may be half the first power supply voltage VINTA1, and when the regulator 510 generates the second power supply voltage VINTA2 the reference voltage VREF1 may be half the second power supply voltage VINTA2.

The first resistor unit 415 may include a plurality of switches and a plurality of resistors. The plurality of the switches may include a first to fourth switches 421 to 424. The plurality of the resistors may include a first to fourth resistors 425 to 428. During the first time interval T1, the power supply voltage provided to the sense amplifier 100 may be the first power supply voltage VINTA1. During the second time interval T2, the power supply voltage provided to the sense amplifier 100 may be the second power supply voltage VINTA2. The second power supply voltage VINTA2 may be greater than the first power supply voltage VINTA1. During first time interval T1, the first power supply voltage VINTA1 may be provided to the sense amplifier 100 through the output node NO by controlling the first to fourth switches 421 to 424 included in the first resistor unit 415. During second time interval T2, the second power supply voltage VINTA2 may be provided to the sense amplifier 100 through the output node NO by controlling the first to fourth switches 421 to 424 included in the first resistor unit 415.

The second resistor unit 417 may include a plurality of switches and a plurality of resistors. The plurality of the switches may include a fifth to eighth switches 441 to 444. The plurality of the resistors may include a fifth to eighth resistors 445 to 448. During the first time interval T1, the power supply voltage provided to the sense amplifier 100 may be the first power supply voltage VINTA1. During the second time interval T2, the power supply voltage provided to the sense amplifier 100 may be the second power supply voltage VINTA2. The second power supply voltage VINTA2 may be greater than the first power supply voltage VINTA1. During first time interval T1, the first power supply voltage VINTA1 may be provided to the sense amplifier 100 through the output node NO by controlling the fifth to eighth switches 441 to 444 included in the second resistor unit 417. During second time interval T2, the second power supply voltage VINTA2 may be provided to the sense amplifier 100 through the output node NO by controlling the fifth to eighth switches 441 to 444 included in the second resistor unit 417.

In an example embodiment, the regulator 510 may generate the first power supply voltage VINTA1 or the second power supply voltage VINTA2 by controlling resistance value of an internal resistor. During the first time interval T1, the resistance value may be a first resistance value. During the second time interval T2, the resistance value may be a second resistance value. For example, the resistance value may be changed by controlling the first to fourth switches 421 to 424 included in the first resistor unit 415. Also, the resistance value may be changed by controlling the fifth to eighth switches 441 to 444 included in the second resistor unit 417.

Figure 20:
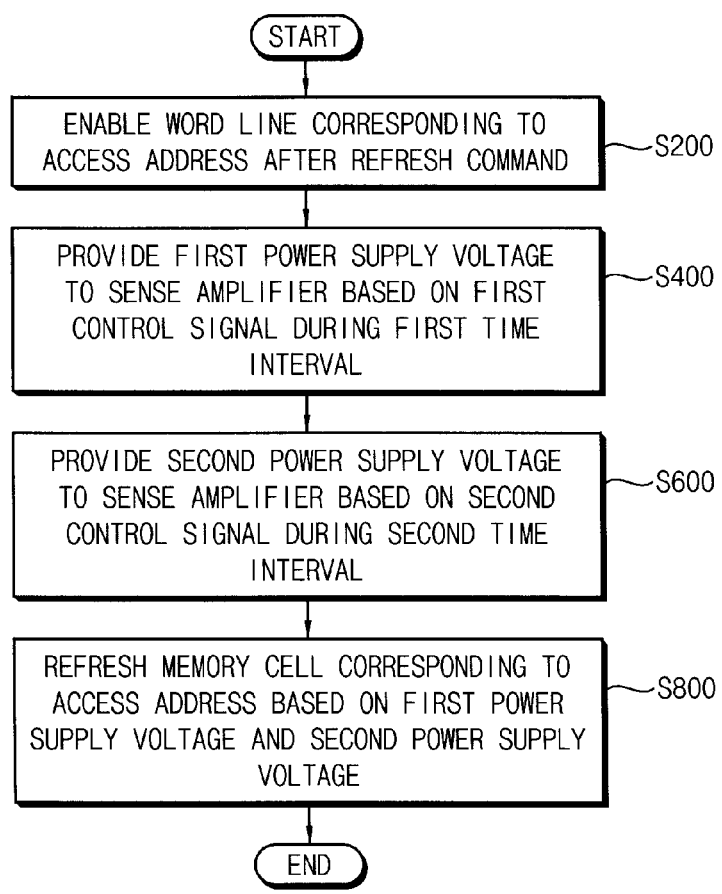
FIG. 20 is a flow chart illustrating a refresh method of a memory device according to example embodiments.
Figure 21:
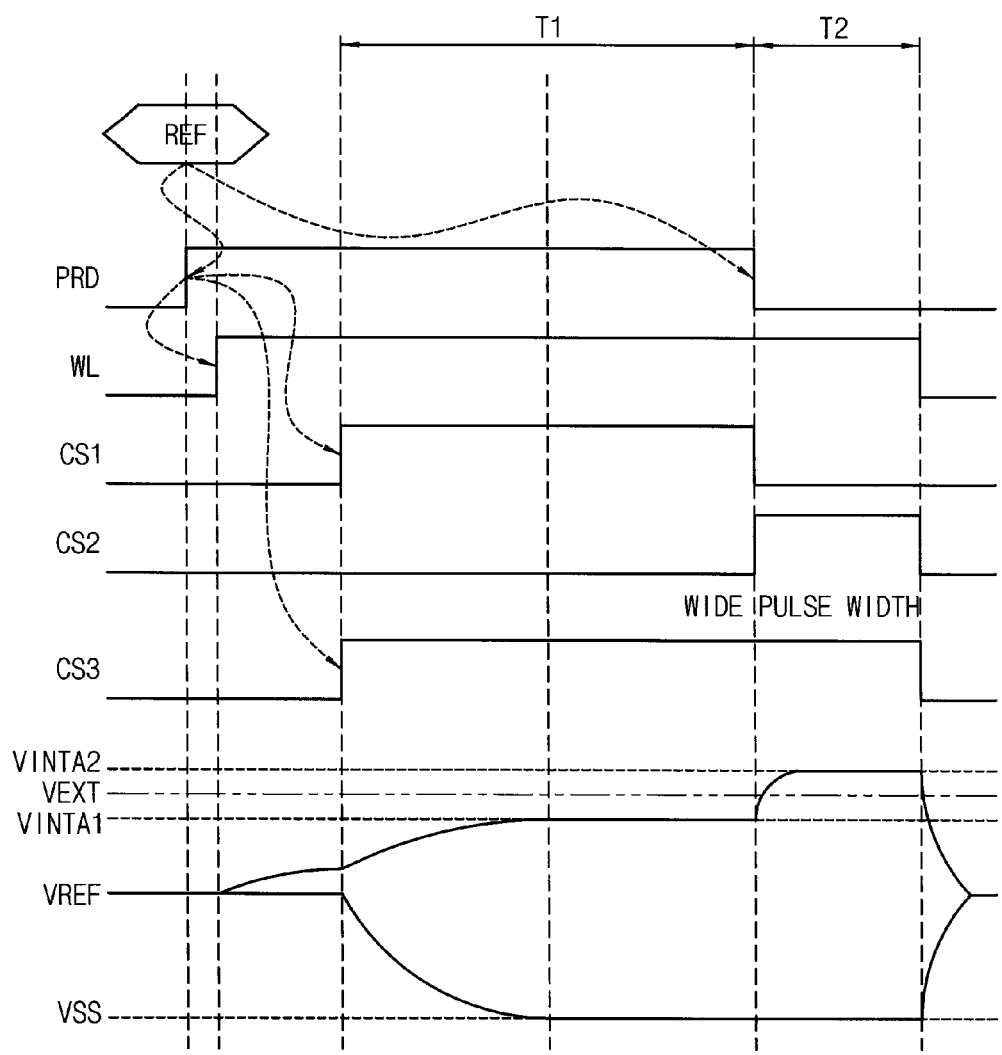
FIG. 21 is a timing diagram for describing a refresh operation of a memory device according to an example embodiment.

FIG. 20 is a flow chart illustrating a refresh method of a memory device according to example embodiments. FIG. 21 is a timing diagram for describing a refresh operation of a memory device according to an example embodiment.

Referring to FIGS. 20 and 21, in a refresh method of memory device, a word line WL corresponding to a received address is enabled after receiving a refresh command REF (S200). The received address may be generated from a counter (not shown). When the refresh command REF is received, a row enable signal PRD may be enabled. If the row enable signal PRD is enabled, the word line WL corresponding to the access address may be enabled. Also, when the refresh command REF is received, the row enable signal PRD and the word line WL corresponding to the access address may be simultaneously enabled.

A first power supply voltage VINTA1 is provided to a sense amplifier 100 based on a first control signal CS1 during a first time interval T1 (S400). The first time interval T1 is between a first time at which a voltage is provided to a bit line BL based on the first power supply voltage VINTA1, and a second time at which the row enable signal PRD is disabled. The charges are included in a memory cell 320 corresponding to the access address.

The sense amplifier 100 may include a first sense amplifier unit 110 and a second sense amplifier unit 130. For example, data included in the memory cell 320 may be 1. If the word line WL is enabled, a turn-on voltage may be applied to a gate of a transistor 310 corresponding to the word line WL. If the turn-on voltage is applied to the gate of the transistor 310 corresponding to the word line WL, charges that are stored in the capacitor 330 included in the memory cell 320 may be provided to the sense amplifier 100 through the bit line BL. For example, a voltage of the complementary bit line BLB may be a reference voltage VREF. The voltage of the bit line BL may be greater than the reference voltage VREF. If the voltage of the complementary bit line BLB is the reference voltage VREF, a voltage of a first node N1 may transition to the first power supply voltage VINTA1 by turning-on the PMOS transistor included in the second sense amplifier unit 130. In one embodiment, the voltage of the first node N1 may have a certain voltage level based on the first power supply voltage VINTA1. If the voltage of the bit line BL is greater than the reference voltage VREF, a voltage of a second node N2 may transition to a ground voltage VSS by turning-on the NMOS transistor included in the first sense amplifier unit 110. The voltage of the first node N1 may be the voltage of the bit line BL and the voltage of the second node N2 may be the voltage of the complementary bit line BLB.

A second power supply voltage VINTA2 is provided to the sense amplifier 100 based on a second control signal CS2 during a second time interval T2, while which the word line WL is enabled after the row enable signal PRD is disabled (S600). The second time interval T2 may be between the second time at which a voltage is provided to the bit line based on the second power supply voltage VINTA2, and a third time at which the word line corresponding to the received address is disabled. The second power supply voltage VINTA2 is greater than the first power supply voltage VINTA1. The word line WL may be enabled even after the row enable signal PRD is disabled. If the second power supply voltage VINTA2 is provided to the sense amplifier 100 during the second time interval T2, the voltage of the first node N1 may transition from the first power supply voltage VINTA1 to the second power supply voltage VINTA2. In one embodiment, the voltage of the first node N1 may have a certain voltage level based on the second power supply voltage VINTA2. As a result, the capacitor 330 included in the memory cell 320 may be refreshed to the second power supply voltage VINTA2 that is greater than the first power supply voltage VINTA1. The memory cell 320 that is refreshed to the second power supply voltage VINTA2 may store the data longer than the memory cell 320 that is restored to the first power supply voltage VINTA1.

The memory cell 320 corresponding to the access address is refreshed based on the first power supply voltage VINTA1 and the second power supply voltage VINTA2 (S800). A method of operating a memory device according to example embodiments may be capable of increasing a performance by refreshing a memory cell 320 based on a second power supply voltage VINTA2 that is greater than a first power supply voltage VINTA1 during a second time interval T2.

In one embodiment, the second time interval T2 when a refresh operation of the memory device is performed after receiving the refresh command REF is longer than the second time interval T2 when a read operation of the memory device is performed after receiving the active command ACT.

Figure 22:
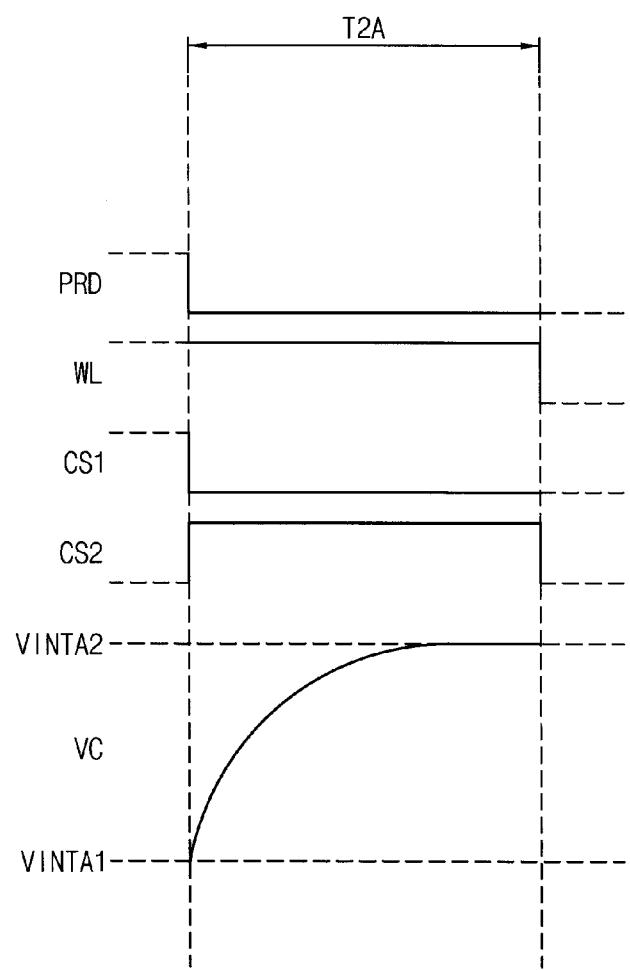
FIGS. 22 and 23 are timing diagrams illustrating a capacitor voltage that is changed as a second time interval is changed, according to example embodiments.
Figure 23:
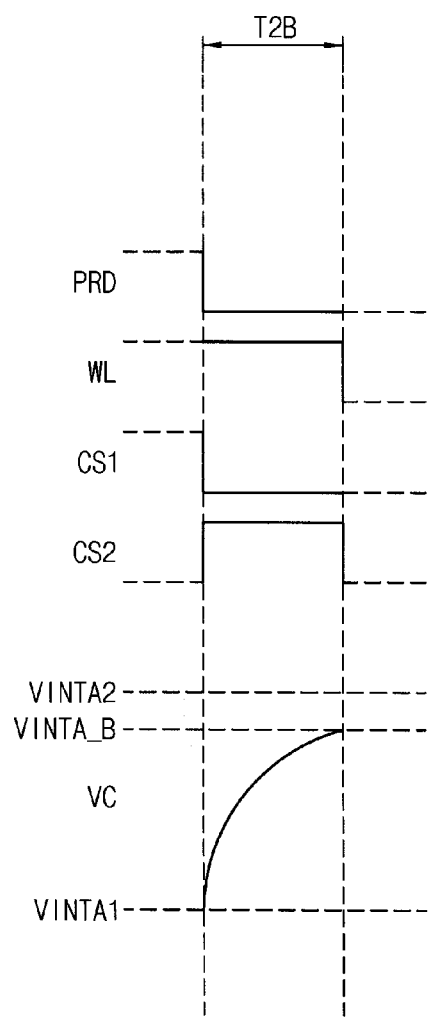

FIGS. 22 and 23 are timing diagrams illustrating a capacitor voltage that is changed as a second time interval is changed, according to example embodiments.

Referring to FIGS. 22 and 23, during the second time interval T2, the first power transistor 150 may be turned-off based on the first control signal CS1. If the first power transistor 150 is turned-off based on the first control signal CS1, the first power supply voltage VINTA1 may not be provided to the sense amplifier 100 through the first power transistor 150. During the second time interval T2, the second power transistor 170 may be turned-on based on the second control signal CS2. If the second power transistor 170 is turned-on based on the second control signal CS2, the second power supply voltage VINTA2 may be provided to the sense amplifier 100 through the second power transistor 170.

In an example embodiment, the second time interval T2 may be increased as the first time interval T1 is decreased.

In an example embodiment, a capacitor voltage VC of the memory cell 320 corresponding to the access address may be increased as the second time interval T2 is increased.

In one embodiment, the second time interval T2 may be a time interval T2A. When the second time interval T2 is the time interval T2A, the voltage of the bit line BL may transition from the first power supply voltage VINTA1 to the second power supply voltage VINTA2. Therefore when the second time interval T2 is the time interval T2A, the capacitor 330 included in the memory cell 320 may be refreshed to the second power supply voltage VINTA2 that is greater than the first power supply voltage VINTA1. In one embodiment, the second time interval T2 may be a time interval T2B. The time interval T2B may be less than the time interval T2A. When the second time interval T2 is the time interval T2B, the voltage of the bit line BL may not transition from the first power supply voltage VINTA1 to the second power supply voltage VINTA2 because the second time interval T2 is short. Therefore when the second time interval T2 is the time interval T2B, the capacitor 330 included in the memory cell 320 may be refreshed to the voltage that is greater than the first power supply voltage VINTA1 and less than the second power supply voltage VINTA2. Therefore the capacitor voltage VC of the memory cell 320 corresponding to the access address may be determined based on the second time interval T2.

Figure 24:
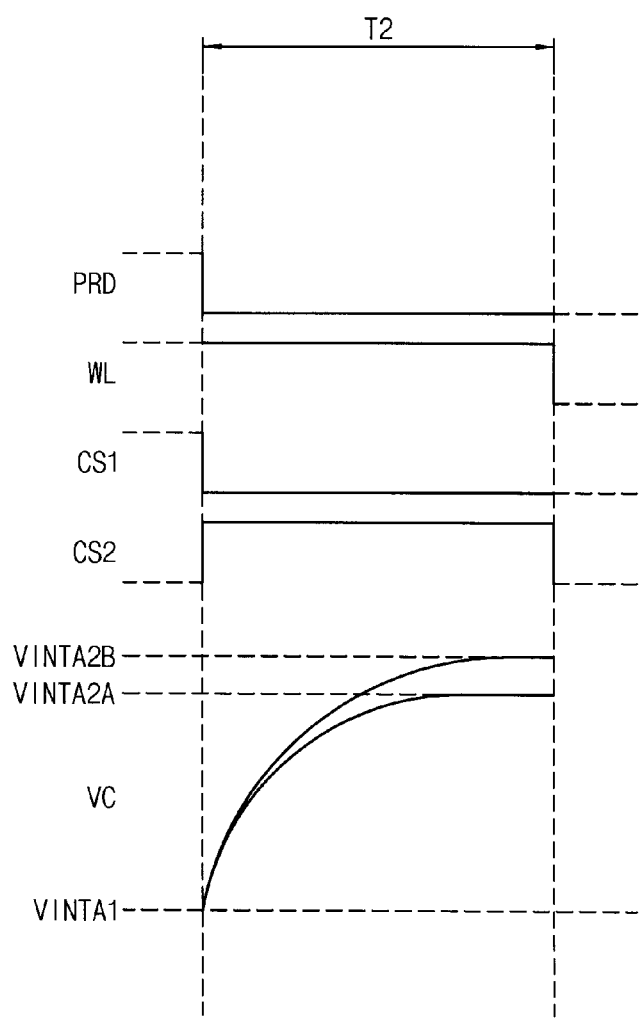
FIG. 24 is a timing diagram illustrating a capacitor voltage that is changed as a second power supply voltage is changed, according to example embodiments.

FIG. 24 is a timing diagram illustrating a capacitor voltage that is changed as a second power supply voltage is changed, according to example embodiments.

Referring to FIG. 24, a capacitor voltage VC of the memory cell 320 corresponding to the access address may be increased as the second power supply voltage VINTA2 is increased. For example, the second power supply voltage VINTA2 may be a first level VINTA2A. When the second power supply voltage VINTA2 is the first level VINTA2A, the voltage of the bit line BL may transition from the first power supply voltage VINTA1 to the first level VINTA2A that is the second power supply voltage VINTA2 during the second time interval T2. Therefore when the second power supply voltage VINTA2 is the first level VINTA2A, the capacitor 330 included in the memory cell 320 may be refreshed to the first level VINTA2A that is greater than the first power supply voltage VINTA1. For example, the second power supply voltage VINTA2 may be a second level VINTA2B. When the second power supply voltage VINTA2 is the second level VINTA2B, the voltage of the bit line BL may transition from the first power supply voltage VINTA1 to the second level VINTA2B that is the second power supply voltage VINTA2 during the second time interval T2. Therefore when the second power supply voltage VINTA2 is the second level VINTA2B, the capacitor 330 included in the memory cell 320 may be refreshed to the second level VINTA2B that is greater than the first power supply voltage VINTA1. Therefore the capacitor voltage VC of the memory cell 320 corresponding to the access address may be determined based on the second power supply voltage VINTA2.

In an example embodiment, the first power supply voltage VINTA1 may be generated by regulating an external power supply voltage VEX using a first regulator 410. The second power supply voltage VINTA2 may be generated by regulating the external power supply voltage VEX using a second regulator 430.

Figure 25:
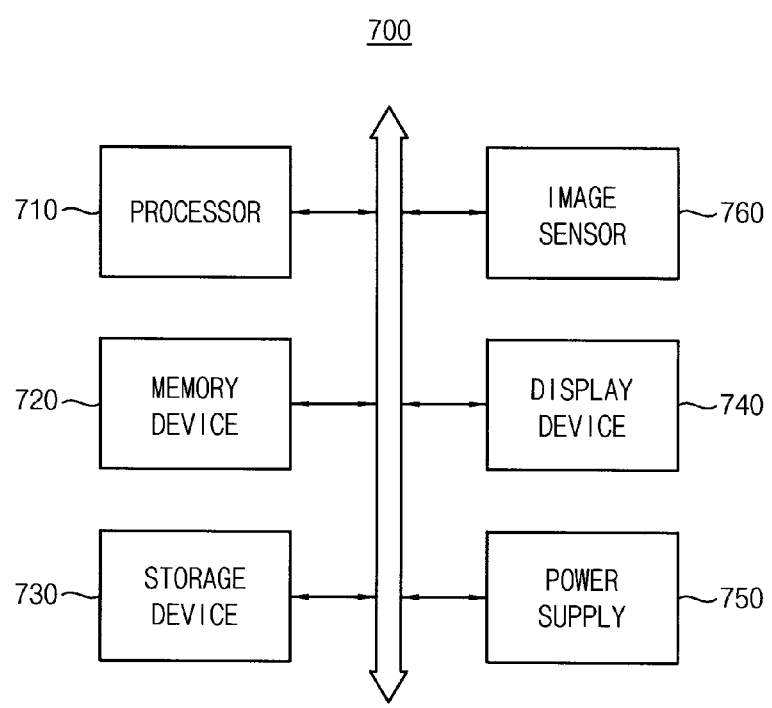
FIG. 25 is a block diagram illustrating a mobile device including a memory module according to example embodiments.

FIG. 25 is a block diagram illustrating a mobile device including a memory module according to example embodiments.

Referring to FIG. 25, a mobile device 700 may include a processor 710, a memory device 720, a storage device 730, a display device 740, a power supply 750 and an image sensor 760. The mobile device 700 may further include ports that communicate with a video card, a sound card, a memory card, a USB device, other electronic devices, etc.

The processor 710 may perform various calculations or tasks. According to embodiments, the processor 710 may be a microprocessor or a CPU. The processor 710 may communicate with the memory device 720, the storage device 730, and the display device 740 via an address bus, a control bus, and/or a data bus. In some embodiments, the processor 710 may be coupled to an extended bus, such as a peripheral component interconnection (PCI) bus. The memory device 720 may be one of memory devices disclosed herein. The memory device 720 may store data for operating the mobile device 700. For example, the memory device 720 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 720 includes the data loading circuit according to example embodiments. The storage device 730 may include a solid state drive (SSD), a hard disk drive (HDD), a CD-ROM, etc. The mobile device 700 may further include an input device such as a touchscreen, a keyboard, a keypad, a mouse, etc., and an output device such as a printer, a display device, etc. The power supply 750 supplies operation voltages for the mobile device 700.

The image sensor 760 may communicate with the processor 710 via the buses or other communication links. The image sensor 760 may be integrated with the processor 710 in one chip, or the image sensor 760 and the processor 710 may be implemented as separate chips.

At least a portion of the mobile device 700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The mobile device 700 may be a digital camera, a mobile phone, a smart phone, a portable multimedia player (PMP), a personal digital assistant (PDA), a computer, etc.

Figure 26:
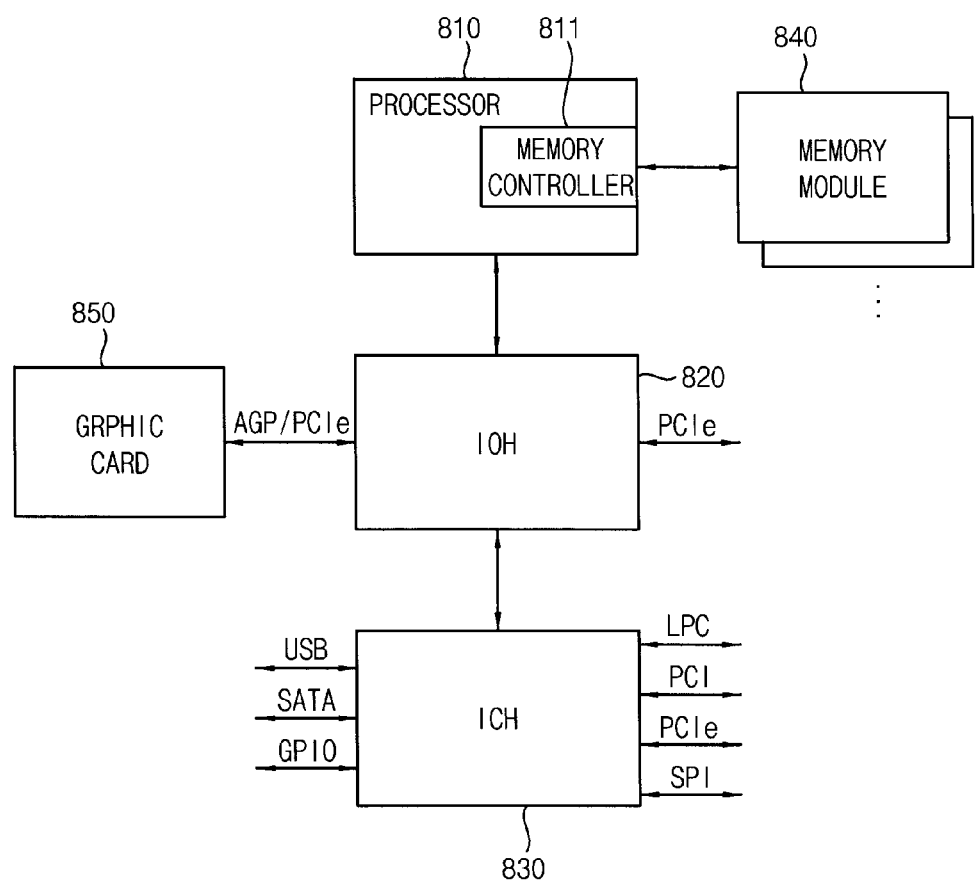
FIG. 26 is a block diagram illustrating a computing system including a memory module according to example embodiments.

FIG. 26 is a block diagram illustrating a computing system including a memory system according to example embodiments.

Referring to FIG. 26, a computing system 800 includes a processor 810, an input/output hub (IOH) 820, an input/output controller hub (ICH) 830, at least one memory module 840 and a graphics card 850. The at least one memory module may include one of the memory devices disclosed herein. In some embodiments, the computing system 800 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, etc. In some embodiments, the computing system 800 may include a plurality of processors. The processor 810 may include an internal or external cache memory.

The processor 810 may include a memory controller 811 for controlling operations of the memory module 840. The memory controller 811 included in the processor 810 may be referred to as an integrated memory controller (IMC). A memory interface between the memory controller 811 and the memory module 840 may be implemented with a single channel including a plurality of signal lines, or may bay be implemented with multiple channels, to each of which at least one memory module 840 may be coupled. In some embodiments, the memory controller 811 may be located inside the input/output hub 820, which may be referred to as memory controller hub (MCH).

The input/output hub 820 may manage data transfer between processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a QuickPath interconnect (QPI), a common system interface (CSI), etc. In some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not shown) for displaying an image. The graphics card 850 may include an internal processor for processing image data and an internal memory device. In some embodiments, the input/output hub 820 may include an internal graphics device along with or instead of the graphics card 850 outside the graphics card 850. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration to efficiently operate various system interfaces. The input/output controller hub 830 may be coupled to the input/output hub 820 via an internal bus, such as a direct media interface (DMI), a hub interface, an enterprise Southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 810, the input/output hub 820 and the input/output controller hub 830 may be implemented as separate chipsets or separate integrated circuits. In other embodiments, at least two of the processor 810, the input/output hub 820 and the input/output controller hub 830 may be implemented as a single chipset.

The present inventive concept may be applied to systems such as be a mobile phone, a smart phone, a personal digital assistant (PDA), a portable multimedia player (PMP), a digital camera, a music player, a portable game console, a navigation system, etc. The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A method of operating a memory device including word lines and bit lines connected to a plurality of memory cells, the method comprising:
    enabling a first word line of the word lines, the first word line corresponding to a first address corresponding to a selected memory cell of the plurality of memory cells, after receiving an active command;
    providing a first power supply voltage having a first voltage level to a sense amplifier connected to a first bit line of the bit lines, the first bit line corresponding to the selected memory cell based on a first control signal during a first time interval, the first time interval being between a first time at which a voltage is provided to the first bit line based on the first power supply voltage, and a second time at which a pre-charge command is received;
    providing a second power supply voltage having a second voltage level greater than the first voltage level to the sense amplifier based on a second control signal during a second time interval, during which the word line is enabled after the pre-charge command is received, the second power supply voltage being irrespective of and greater than the first power supply voltage; and
    restoring the selected memory cell corresponding to the first address based on the first power supply voltage and the second power supply voltage,
    wherein the first power supply voltage is provided by regulating a first external voltage having a third voltage level, using a first regulator,
    wherein the second power supply voltage is provided by regulating a second external voltage having a fourth voltage level, using a second regulator, and
    wherein the third voltage level is less than the fourth voltage level, and the fourth voltage level is less than the second voltage level.

2. The method of claim 1, wherein during the first time interval, the first control signal is a first logic level and the second control signal is a second logic level opposite to the first logic level, and
    wherein during the second time interval, the first control signal is the second logic level and the second control signal is the first logic level.

3. The method of claim 2, wherein a ground voltage is provided to the sense amplifier based on a third control signal, and
    wherein during the first time interval and the second time interval, the third control signal is the first logic level.

4. The method of claim 1, wherein during the first time interval, the sense amplifier pre-charges the first bit line and a complementary first bit line based on the first power supply voltage, and
    wherein during the second time interval, the sense amplifier pre-charges the first bit line and the complementary first bit line based on the second power supply voltage.

5. The method of claim 1, wherein a voltage of a capacitor of the selected memory cell corresponding to the first address is determined based on the second time interval, and
    wherein the voltage of the capacitor is increased as the second time interval is increased.

6. The method of claim 1, wherein a voltage of a capacitor voltage of the selected memory cell corresponding to the first address is determined based on the second power supply voltage, and
    wherein the voltage of the capacitor is increased as the second power supply voltage is increased.

7. The method of claim 1, wherein each of the first power supply voltage and the second power supply voltage is provided by controlling a resistance value of an internal resistor, and
    wherein during the first time interval, the resistance value is a first resistance value and during the second time interval, the resistance value is a second resistance value.

8. A method of operating a memory device including word lines and bit lines connected to a plurality of memory cells, the method comprising:
    generating a first power supply voltage having a first voltage level greater than a ground voltage level, and a second power supply voltage having a second voltage level greater than the first voltage level, based on an external power supply voltage received from outside the memory device;
    enabling a first word line of the word lines connected to a selected memory cell of the memory cells;
    providing the first power supply voltage to a sense amplifier connected to a first bit line of the bit lines, the first bit line corresponding to the selected memory cell, after enabling the first word line, such that a first voltage is provided to the first bit line based on the first power supply voltage; and
    providing the second power supply voltage to the sense amplifier during enabling the first word line, such that a second voltage is provided to the first bit line based on the second power supply voltage,
    wherein a voltage level of the second voltage is greater than a voltage level of the first voltage,
    wherein the external power supply voltage includes a first external power supply voltage having a third voltage level, and a second external power supply voltage having a fourth voltage level, the third voltage level less than the first voltage level, and the fourth voltage level less than the second voltage level and greater than the third voltage level,
    wherein the first power supply voltage is generated by a first regulator based on the first external power supply voltage, and
    wherein the second power supply voltage is generated by a second regulator based on the second external power supply voltage.

9. The method of claim 8, further comprising:
    disabling the first word line after a period of time from receiving a precharge command,
    wherein the period of time has a first time value during performing a read operation of the memory device, and wherein the period of time has a second time value longer than the first time value during performing a refresh operation of the memory device.

* * * * *